United States Patent [19]
Jeong

[11] Patent Number: 5,587,709
[45] Date of Patent: Dec. 24, 1996

[54] HIGH SPEED SERIAL LINK FOR FULLY DUPLEXED DATA COMMUNICATION

[75] Inventor: Deog-Kyoon Jeong, Gyosu Apt. Ga-201, Bongchun-7-Dong, Kwanak-Ku, Seoul, Rep. of Korea

[73] Assignees: Deog-Kyoon Jeong, Seoul, Rep. of Korea; Sun Microsystems, Inc., Mountain View, Calif.

[21] Appl. No.: 580,571

[22] Filed: Dec. 29, 1995

Related U.S. Application Data

[62] Division of Ser. No. 254,326, Jun. 6, 1994.

[51] Int. Cl.$^6$ ........................................... H03M 9/00
[52] U.S. Cl. ................................. 341/100; 375/371
[58] Field of Search ........................ 341/100, 101; 375/371, 373, 376

[56] References Cited

U.S. PATENT DOCUMENTS

| | | | |
|---|---|---|---|
| 4,841,551 | 6/1989 | Avaneas | 375/371 |
| 4,987,322 | 1/1991 | Wheeler . | |
| 5,155,486 | 10/1992 | Murfet et al. | 341/100 |
| 5,253,254 | 10/1993 | Roberts et al. | 370/100.1 |
| 5,287,359 | 2/1994 | Engelese | 370/100.1 |
| 5,367,542 | 11/1994 | Guo | 375/371 |
| 5,412,698 | 5/1995 | Van Brant et al. | 375/371 |

OTHER PUBLICATIONS

R. Marbot et al., "Integration of Multiple Bidirectional Point-to-Point Serial Links in the Gigabites per Second Range", BULL Serial Link Technology, Hot Interconnects Symposium, 1993, France.
R. Marbot, "Bull's High-Speed Serial Link Development", Bull Serial Link Technology, Oct. 9, 1991.
"G-Taxichips 1.25 Gbits/sec Data Communications Chipset Preliminary Data Sheet", Vitesse Semiconductor Corporation, Camarillo, CA, Jun. 15, 1993.
T. Knight, Jr. et al., "A Self-Terminating Low-Voltage Swing CMOS Output Driver", IEEE Journal of Solid State Circuits, vol. 23, No. 2, Apr. 1988.

*Primary Examiner*—Howard L. Williams
*Attorney, Agent, or Firm*—Townsend and Townsend and Crew LLP

[57] ABSTRACT

A system for converting between parallel data and serial data is described. In the system (10), individual bits of the parallel data (12) are latched into individual registers (117). Each register (117) is coupled to a corresponding AND gate (110) which is also connected to receive phased clock signals. The output terminals of the AND gates (110) are connected to an OR gate (115). Using the system, with appropriately phased clocks, the parallel data is converted into serial data.

20 Claims, 18 Drawing Sheets

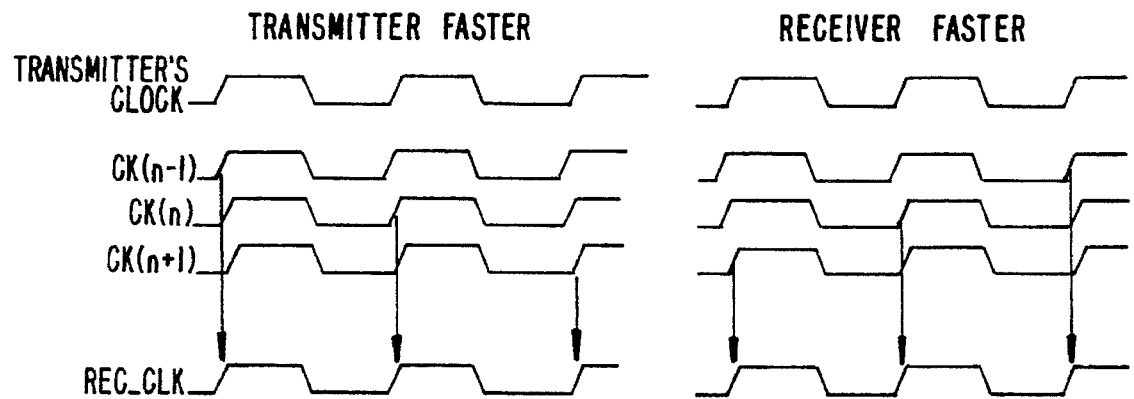
FIG. 13A.
FIG. 13B.
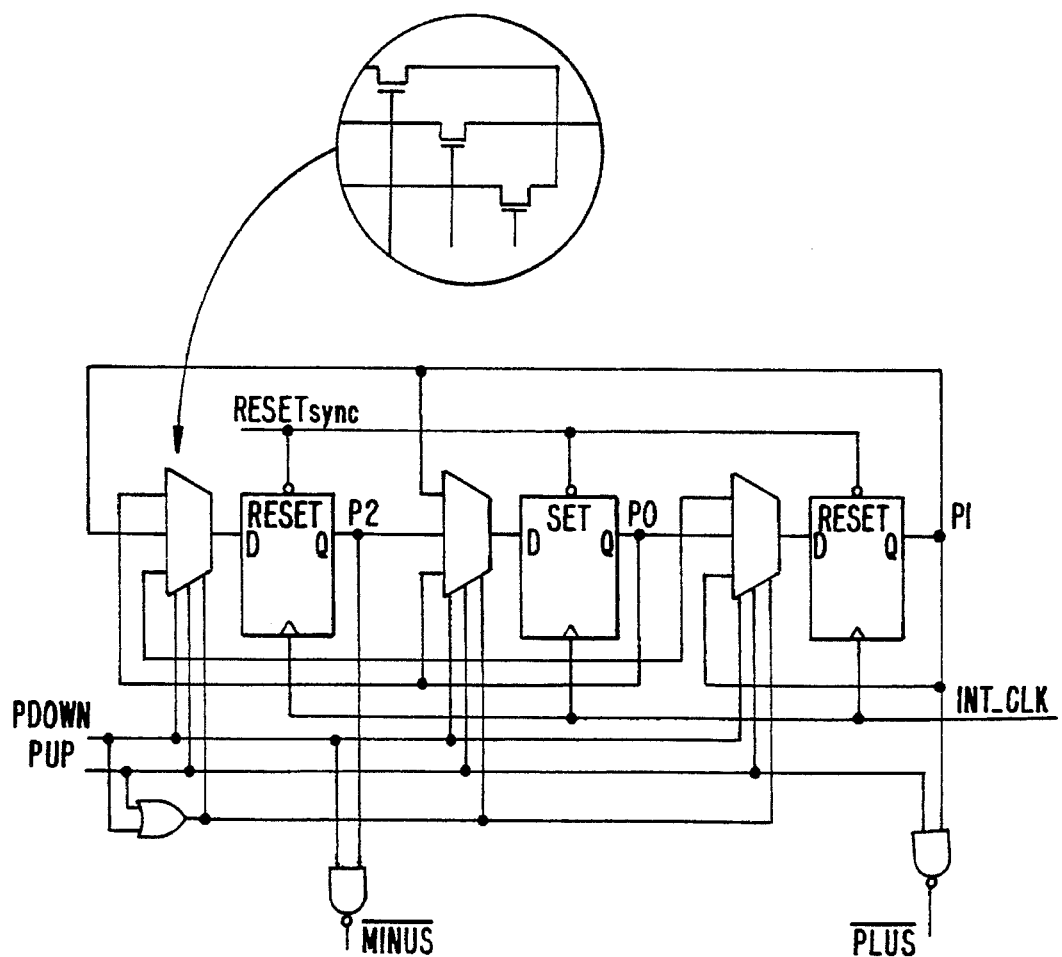
FIG. 14.

HIGH SPEED SERIAL LINK FOR FULLY DUPLEXED DATA COMMUNICATION

This is a Division of application Ser. No. 08/254,326 filed Jun. 6, 1994.

BACKGROUND OF THE INVENTION

This invention relates to a system for providing a high speed serial communications link allowing fully duplexed serial data communication. In particular, this invention relates to an interface circuit for interconnecting devices with parallel datapaths via such a serial link.

As electronic and computer technology continues to evolve, communication of information among different devices, either situated near by or at a distance becomes increasingly important. For example, it is now more desirable than ever to provide for high speed communications among different chips on a circuit board, different circuit boards in a system, and different systems with each other. It is also increasingly desirable to provide such communications at very high speeds, especially in view of the large amount of data required for data communications in intensive data consuming systems using graphical or video information, multiple input-output channels, local area networks, and the like.

It is particularly desirable to enable individual personal computers, workstations, or other computing devices, within which data is normally internally transferred using parallel data buses, to communicate with each other over relatively simple transmission lines. Such transmission lines typically include only one or two conductors, in contrast with the 64-bit and wider data paths within computing systems now commonly available.

There have been a number of commercially available products which attempt to provide high speed conversion of parallel data to serial form and transmission over a serial link. The Hewlett-Packard G-link chip set is one such product. That chip set includes a transmitter set and is capable of handling 20- or 24-bit wide parallel data. To obtain the necessary speed, however, the chip set is fabricated using a bipolar process, and the receiver and transmitter require separate chips. Such a solution is highly power consumptive and expensive. It also employs a conventional approach to parallel-to-serial data conversion, that is, the use of a phase locked loop oscillator operating at the transmission rate. Such devices typically introduce noise into the silicon substrate and interfere with other phase-locked loop circuitry on the chip. This makes it difficult to integrate many channels on a single chip.

Another commercial solution has been provided by Bull of France. The Bull technology employs a frequency multiplier for parallel to serial data conversion. Such devices typically introduce noise into the silicon substrate and interfere with other multipliers on the chip. In addition, the Bull technology uses an exclusive OR tree for parallel to serial conversion. The use of exclusive OR trees is well known, together with the difficulty of equalizing the delay through all paths of such devices. The Bull technology employs a delayed-locked loop circuit that mandates the use of a special coding scheme which could result in reduced coding efficiency.

SUMMARY OF THE INVENTION

The present invention is a receiver for receiving and converting serial data input stream from a transmitter to a parallel data output stream. The invention is capable of very high speed operation. The invention can convert parallel data to serial data at speeds greater than one gigabit per second for transmission over a serial communications link. The invention may be fabricated relatively inexpensively using CMOS technology, as opposed to gallium arsenide, bipolar, and other technologies conventionally employed to fabricate such high speed systems. Also, the invention provides a technique for converting serial data to parallel data in which only a single oscillator is required for many channels thereby eliminating the possibility of injection effects which make all the oscillators attached to individual channels falsely synchronize to a single frequency in prior art devices.

In a preferred embodiment, the clock signals between the originating station (i.e., transmitter) and the receiver are not synchronized. In order to properly resolve the data stream, the receiver determines the proper frame boundaries for words in the serial data input stream. Upon power-up, the receiver is initialized. In particular, known serial data is sent between the originating station and the receiver. Using this known data, the receiver synchronizes itself and finds the proper frame boundaries for words in the known serial data. A plurality of clock signals, each clock signal having a different phase is used by the receiver. An appropriate reference clock phase is selected that indicates the proper frame boundaries.

In the receiver, the states of serial data are detected using a data sampler. The data sampler oversamples the data and determines the states of data at time intervals corresponding to the different clock phases. In a particular embodiment, the data is three-times oversampled. The sampled data from the data sampler is aligned to the proper frame boundaries in a data aligner (or data shuffler). The data aligner uses the reference clock phase to determine the proper word boundaries. The sampled data from the data aligner is provided to a data selector (or data separator), which selects a portion of the samples of the data which are of the proper phase. The data selector will also use the reference clock phase to determine the proper phase information. An output from the data selector is the parallel recovered data.

The receiver also includes circuitry for taking care of phase shifts and other similar changes. An edge voter counts the number of edge transitions between the time intervals that the data samples were taken. From the number of edge transitions, a tracking filter adjusts the reference clock phase so that the data aligner tracks phase shifts in the frame boundaries of the words.

In one embodiment, a receiver for converting a serial data input stream into a parallel data output stream includes a plurality of registers for receiving the serial data input stream. A clock generator is provided for supplying a plurality of clock signals to the plurality of registers. A sampler detects the state of the data in the registers in response to the clock signals. The sampler supplies output signals indicative of the data. A data aligner is connected to receive the output signals from the parallel sampler and in response, partitions the data into words. A voter is connected to the data aligner to detect zero crossings from the data samples to find a position with the most edge transitions. A data separator is provided for converting the serial data from the voter into parallel data.

Other objects, features, and advantages of the present invention will become apparent upon consideration of the following detailed description and the accompanying drawings, in which like reference designations represent like features throughout the figures.

3

BRIEF DESCRIPTION OF THE DRAWINGS

FIGS. 13a and 13b illustrate the clock selection process based on the relative speeds of the transmitter and receiver;

FIG. 14 is a detailed circuit schematic illustrating the phase pointer;

DESCRIPTION OF THE SPECIFIC EMBODIMENTS

Figure 1:
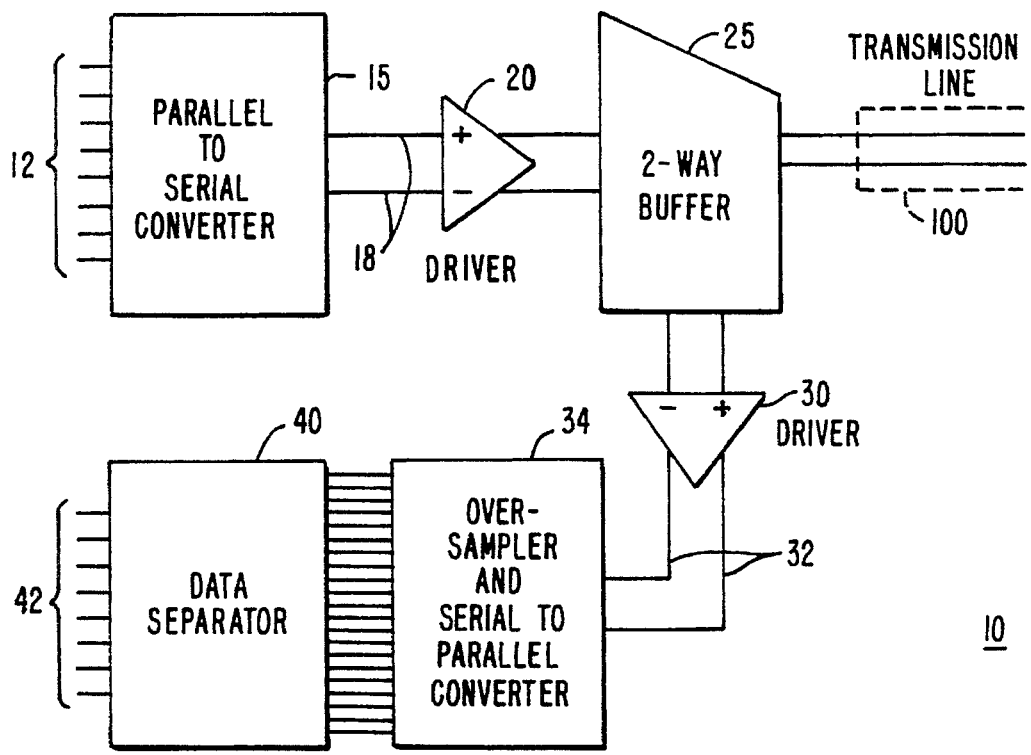
FIG. 1 is a block diagram illustrating at a high level the serial link interface system.

FIG. 1 is a high level block diagram of a system which provides a serial link for fully duplexed high speed data communication. As shown in FIG. 1, the system is coupled to a transmission line 100. Generally, the system includes a parallel interface 12 which is coupled to desired other apparatus. For example, interface 12 may be coupled to the bus of a workstation, a personal computer, high definition television, a local area network, a printed circuit board or the like. In essence, interface 12 may be coupled to any outside apparatus which provides data in parallel over a series of lines or "bus." Once data is received at the interface, it is then supplied to a parallel-to-serial converter 15. Converter 15 converts the parallel bit stream from interface 12 into a serial bit stream and supplies it differentially to a driver circuit 20 capable of driving the signals on the transmission line 100. From driver circuit 20 the signals are transferred to a two-way buffer 25 which is coupled directly to the transmission line 100. The two-way buffer 25 enables signals to be supplied to the transmission line and received from the transmission line simultaneously. The path from converter 15 through driver 20 and buffer 25 is provided for outgoing data, that is, data which is to be placed on the transmission line and sent to a remote chip, PC board, system, or other apparatus. Transmission line 100 is a twinax or twisted pair and typically functions as a point-to-point link.

Incoming data on the transmission line, which can be present simultaneously with the outgoing data, is extracted by the two-way buffer 25 from the combined incoming/outgoing signal on the media 100. The incoming data is then supplied through driver 30 to serial-to-parallel converter 34. Converter 34 accepts the serial data, supplied in differential form on lines 32, samples it and converts it to parallel data. After conversion the data is supplied to a data separator 40 which extracts the appropriate bits from the oversampled data bits and places them on an output interface 42. In a manner similar to input interface 12, output interface 42 is connected to an external computer system, or other desired apparatus to which the data is to be supplied.

Figure 2A:
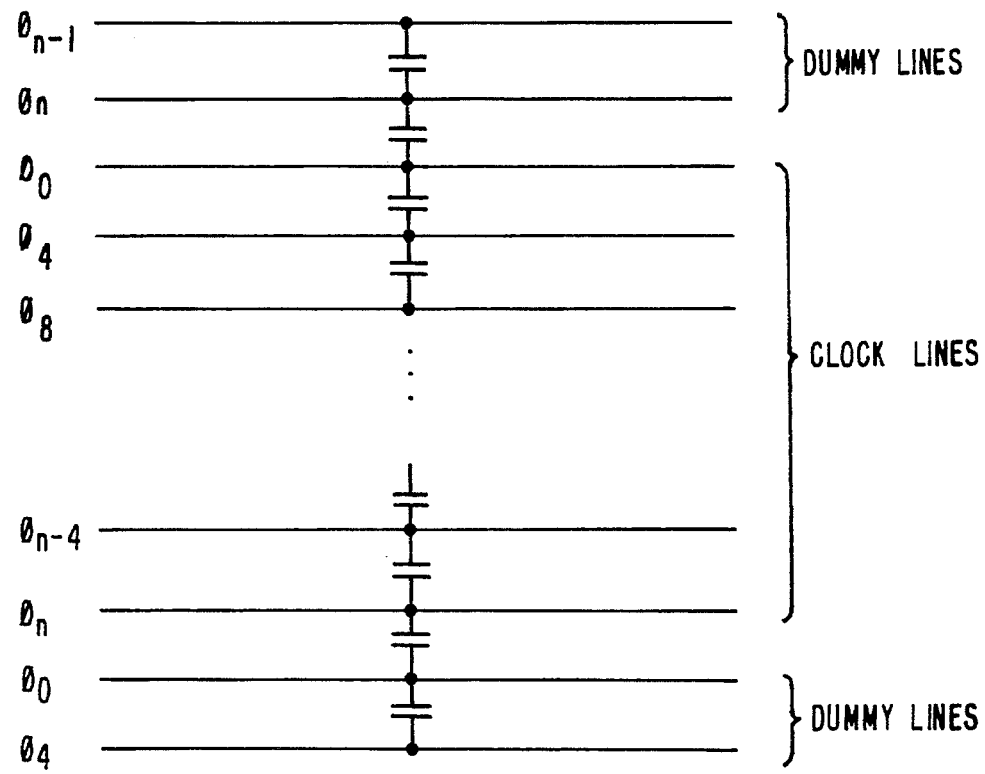
FIG. 2a is a more detailed diagram illustrating the arrangement of clock conductors within FIG. 2.
Figure 2:
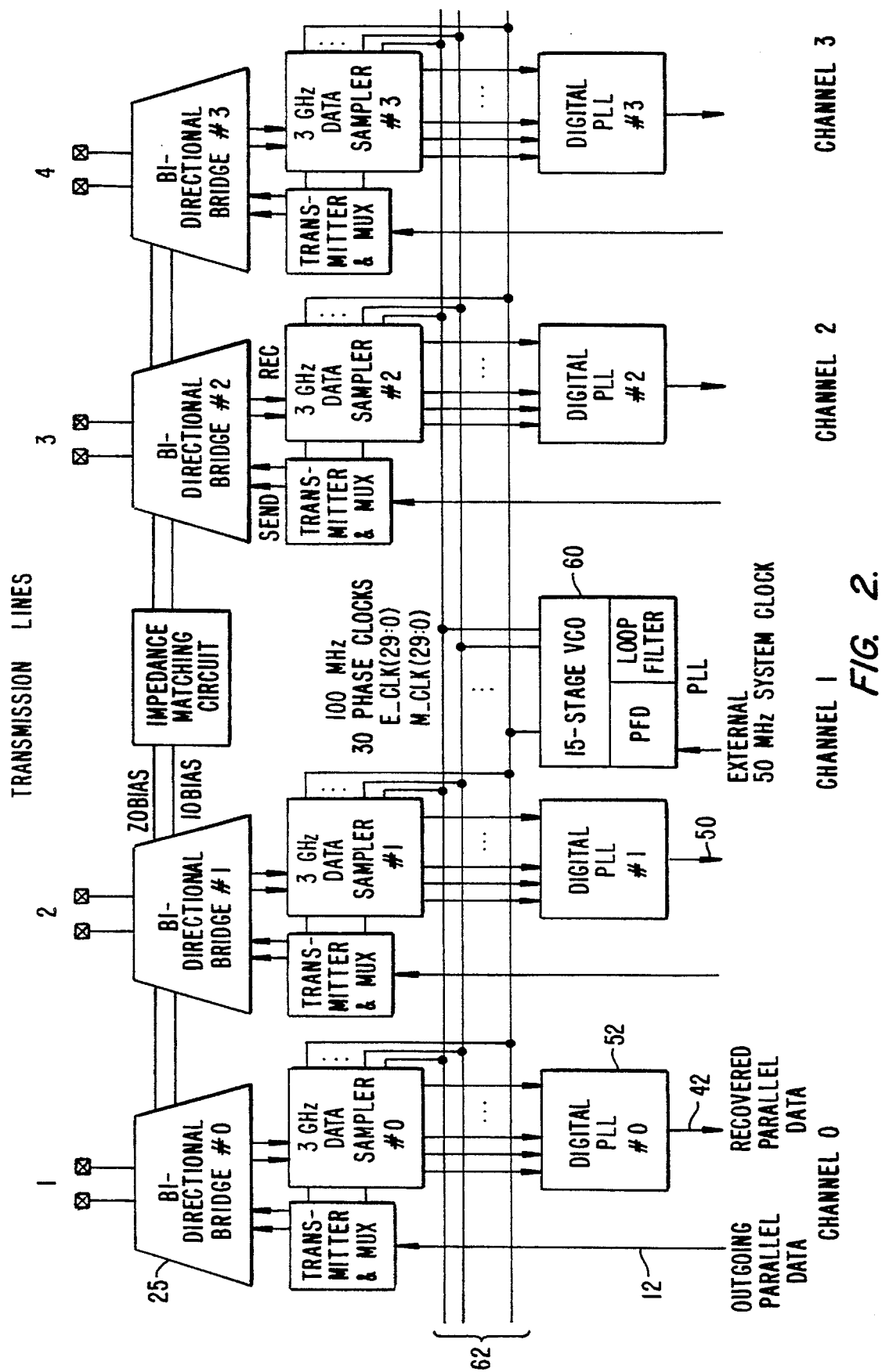
FIG. 2 is a more derailed block diagram illustrating the serial link interface.

FIG. 2 is a more detailed block diagram of the serial link with four channels. FIG. 2 illustrates in greater detail the interrelationship between the components of the system 10, together with the manner in which a group of serial link systems can be commonly controlled to interface with a group of serial links. Also shown 25 is the manner in which a common dock signal and common impedance matching circuit may be shared among several channels of serial links.

Each channel of the serial link, for example channel 0, includes a parallel interface 12 from an external system 50, together with an interface 42 for providing data to the external system 50. In operation, the data on interface 12 is supplied to a transmitter, the detailed structure of which is described below. A bidirectional buffer 25 receives the serial data from the transmitter and places it on the serial link transmission line 100. Similarly, serial data from the transmission line 100 is received by the bidirectional buffer 25, sampled by a sampler 34, and then supplied to a receiver 52 for conversion to parallel data. A parallel bus is provided to the external system 50 from the receiver.

A high speed clock 60, described in more detail below, is coupled both to the serial link 100 and to a series of conductors 62 for distributing the clock signals among the transmitters. The receivers are also coupled to clock line 62. The high speed clock is an important part of the system. In conventional data serializers, D-type flip-flops or latches are configured as parallel-in serial-out shift registers. Unfortunately, when using such an approach, it is difficult to manufacture a very high speed data serializer because of the difficulty of generating and handling clock signals whose frequency equals the data rate. It is also difficult to design the flip-flops or latches to operate at the speed of such a clock. Thus, in a serializer with a bit rate exceeding 1 gigabit per second, it would be very difficult to generate a clock with that high a frequency, as well as latches, flip-flops, etc. The difficulty is even more substantial when it is desired not to employ high power consuming or futuristic semiconductor technologies. Bipolar technology, for example, is capable of switching at such speeds, but generally consumes a large amount of power, necessitating high capability power sources, chip cooling, and similar problems. Gallium arsenide is another technology which can provide such high speed clocks; however, components manufactured using gallium arsenide technology are generally expensive and not widely available. In contrast, CMOS technology is widely available, relatively inexpensive, and generally does not consume much standby power.

To overcome these disadvantages, the clock 60 of our system, along with the remainder of the system, preferably is fabricated using standard CMOS technology, yet enables the provision of a sufficient number of clock phases to adequately handle data rates on the order of greater than one gigabit per second.

FIG. 2a is a diagram illustrating the layout of the clock lines shown in FIG. 2. When multiple clocks are distributed across a circuit board or other substrate, crosstalk from neighboring wires impacts the signal delay on each clock line. FIG. 2a illustrates a series of parallel clock lines, each capacitively coupled to an adjoining clock line. If the clocks are multiphase clocks with equally spaced phases, the clock signals in the middle of the set of lines will be affected in the same way as the signals on adjoining clock lines, thereby nullifying the adverse effect of the capacitive coupling. The only exception to the nullification are the clock lines near the edges of the parallel conductors. Because those clock lines have one of their neighbors missing, there is an asymmetrical effect, thereby causing clock skew. As depicted in FIG. 2a, however, in the preferred embodiment of this system, dummy clock wires are distributed to make clock lines on each edge of the parallel group receive symmetrical coupling from the dummy wires, thereby removing any skew. Thus, clock phases $\phi_0$ and $\phi_1$ are duplicated and placed adjacent to the lines carrying clock phase $\phi_n$. Similarly, lines carrying $\phi_{n-1}$ and $\phi_n$ are placed adjacent the line carrying clock phase $\phi_0$. In this manner, the asymmetrical capacitive coupling is nullified. In an embodiment in which every clock line is required rather than every fourth line, the layout is modified accordingly so that $\phi_0, \phi_1, \phi_2, \ldots, \phi_{n-1}, \phi_n$ are adjacent. In another embodiment, clock lines can be placed in such a way that neighboring clocks have settled into static 0 or 1, when the one in the middle makes a transition. For example, with 30 phase clocks, $\phi_0$ must have its neighbors be $\phi_5, \phi_6, \phi_{25}$ or $\phi_{26}$, but not with $\phi_{29}$ or $\phi_1$. Of course, numerous lines are needed at the far sides of the bus.

Figure 3:
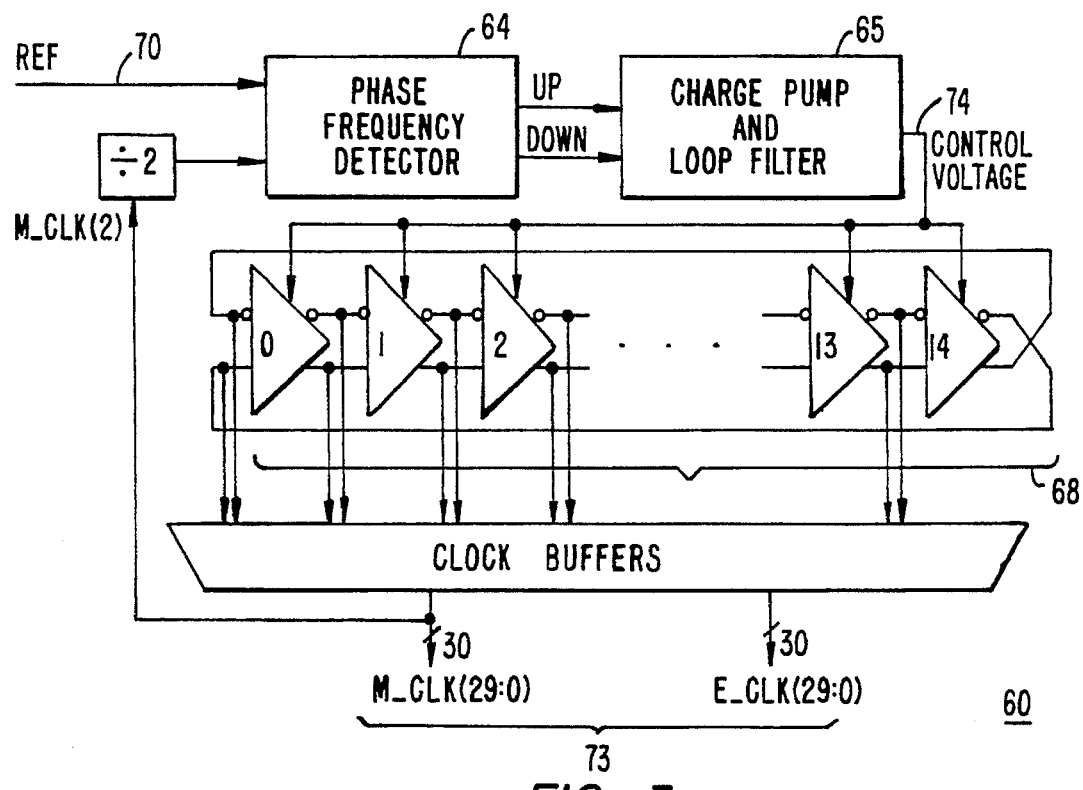
FIG. 3 is a block diagram illustrating the clock generator.

FIG. 3 is a block diagram of clock circuit 60 used to generate the phase clocks supplied to the serial link system, whether employed singly or in a multiple channel embodiment such as depicted in FIG. 2. As shown in FIG. 3, the clock system includes a phase frequency detector 64, a charge pump and loop filter 65, and a series of delay cells 68. The circuit depicted functions to receive a reference clock signal on line 70, and in response to transitions in that clock signal generate a desired number of internal clocks on output lines 73 due to the effect of a frequency divider. Each of the clocks corresponds to a phase shifted clock signal. In the embodiment shown, the 30 equal phase shifted clock signals are generated with twice the reference frequency. In other words, between two sequential rising edges there are 29 rising edges of an internal clock. With a 50 MHz external reference clock, the system effectively can supply a much higher speed clock, for example, in the embodiment, the number of edges possible with a single clock frequency of the 30 clocks is 3 GHz. These multiple phase clocks can then be used to control the transmitter and data sampling functions of the serial link. For the particular embodiment depicted, 10 phase clocks (every third one of the thirty) are supplied to the transmitters and 30 phase clocks are supplied to the data sampler. The 30 outputs from the data sampler can then be examined in the receiver to recover the correct data and original reference clock. Using the embodiment depicted in FIG. 2, the phase clocks also can be shared among various channels of serial link systems.

The embodiment depicted in FIG. 3 functions as a phase-locked loop. The phase detector 64 compares the frequency of one of the subphase clocks ck0 73, after division by two, from one delay cell with the frequency of the reference clock signal on line 70. The output of the phase detector, after passing through loop filter 65, is fed back through the delay cells to keep the delay precisely in phase with the reference clock signal. In this manner, the subfrequency clock signals on lines 73 are equal divisions of the original reference clock.

Phase frequency detector 64 provides an output signal which is related to the phase difference between the reference clock signal and the oscillator clock signal from a stage of the delay cells. This enables the oscillator clock to be controlled in synchronism with the reference clock signal. The output of the phase frequency detector 64 controls the charge pump and loop filter 65, resulting in a control voltage being supplied on line 74 to the delay cells 73. The control voltage speeds or slows the delay cells. Each of the delay cells provides an output signal which is delayed slightly from the output signal of a preceding delay cell. By virtue of the phase lock loop, each of the outputs of the delay cells will be an integral division of the frequency of the reference clock signal. The frequency f of the oscillator is controlled by the control voltage with the relationship $$f = \frac{1}{2 \cdot N \cdot Td}$$

where N is the number of delay stages and Td is the delay time of each delay cell as a function of the control voltage.

The clock generator includes a voltage controlled oscillator (VCO) constructed with 15-stage differential delay cells, a frequency divider, a phase frequency detector, a charge pump, a loop filter, and clock buffers. Because each phase clock is buffered by two parallel buffers, two groups of 100 MHz, 30-phase clocks are generated from the clock buffers. Separating the equally loaded and equally spaced 'clean' clocks from the 'dirty' clocks is the reason each phase clock is buffered by two clock buffers and produces two clocks that have equal phases for the two groups of 30-phase clocks to be generated. One set is used as 3 GHz data oversampling clocks in the receiver. In data oversampling it is important that the sensing interval be as equally spaced as possible, that is, the sensing interval is to be controlled to within 0.33 ns. This set of clocks must be equally spaced and equally loaded, that is, 'clean' clocks. The other set of clocks is used for the transmitter clocking, with one clock being used by the data-loader contained by the transmitter for loading 10 bits input parallel data. The clocks 73 are 100 MHz 10-phase clocks. The interval of each phase is equal to the transmission time of one bit serial datum.

Figure 4:
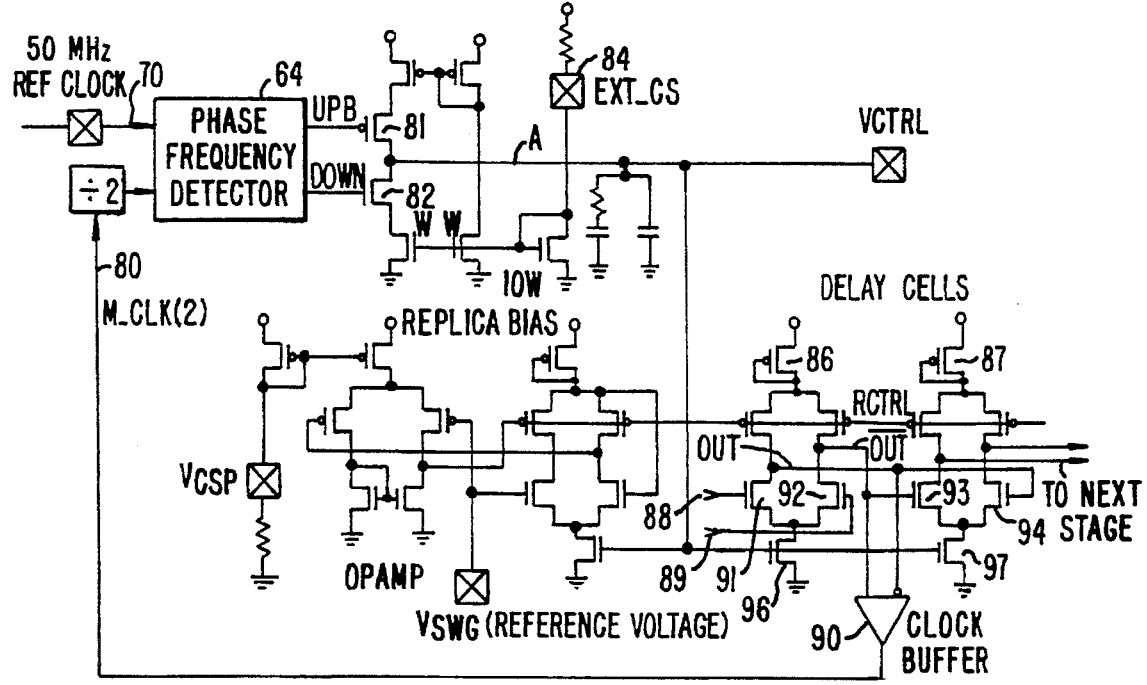
FIG. 4 is a derailed circuit schematic illustrating the clock generator.

FIG. 4 is a circuit schematic illustrating the circuit structure of the clock generator. In the lower right-hand portion of FIG. 4, two delay cells 86 and 87 are shown. Each of delay cells 86 and 87 correspond to one delay cell in the 30 stages of delay cells 68 shown in FIG. 3. At nodes 88 and 89, delay cell 86 receives the reference clock signal and its inverse. The clock signal toggles transistors 91 and 92 on and off generating output signals OUT and $\overline{OUT}$ which are used to control clock driver circuit 90. Clock buffer circuit 90 is a conventional clock buffer and uses the differential output signals to generate clock signal ck0. The same output signals used for ck0 are also coupled to provide input clock signals to transistors 93 and 94 in delay cell 87. In the same manner, delay cell 87 provides output signals at an intermediate node which are both supplied to clock driver 95 to generate clock signal ck1, and passed to a subsequent delay stage (not shown). Because of the switching delay in each stage of delay cells, the input clock signal for each subsequent stage of delay cells will be slightly delayed from the input clock signal at preceding stages. Thus, clocks ck0, ck1, ck2, . . . , ckn will each be delayed from the preceding clock by a small amount.

One of the clock signals, in the example, ck0, however, is also coupled back via line 80 to phase frequency detector 64 where it is compared with the original reference clock signal arriving on line 70. Depending upon the phase relationship of the reference clock and the clock chosen from the delay cell chain, the phase frequency detector will supply output control signals to turn on and off transistors 81 and 82. Phase frequency detector 64 is of well known design. The control signal supplied from phase frequency detector 64 will pull the node A between transistors 81 and 82 up or down, depending upon the phase relationship of the reference clock and clock ck0. When transistor 81 is on, current is pumped into the node A which increases the control voltage applied to transistors 96, 97, etc., commonly coupled to node A. This increased voltage turns on transistors 96 and 97 more strongly, thereby shortening the switching time of transistors 91, 92, 93, 94, etc., in turn, shortening the clock delay within each stage. On the other hand, if transistor 82 is on, node A is pulled down, lowering the control voltage on node A and slowing the operation of each delay cell.

A well known loop filtering circuit is also provided and coupled to node A, as shown. In addition, an external current control resistor is coupled to node 84 and used to control the maximum current which can be drawn by the phase frequency detector control signals.

Also depicted is a replica bias circuit which is coupled to the control nodes of transistors 96, 97, etc., as well as to other transistors in the delay cell chain. This replica bias circuit stabilizes the voltage on the delay cells by minimizing the impact of fluctuations in the power supply (VDD) caused by the switching of the delay cells.

Thus, the output of each delay cell is tapped to provide a clock signal which is supplied through a corresponding clock driver 90 to one of the clock lines shown in FIG. 2. In this manner, a series of equally spaced clock signals, each of a slightly different phase than the preceding clock signal, is provided for use by the transmitters and receivers of the serial link.

As described, the delay cells are implemented with a differential structure that contains a voltage controlled resistor (VCR) controlled by a replica biasing circuit. The differential structured delay cell is used to support a high frequency oscillation. The replica biasing circuit has the same structure as the VCO delay cell. Thus, the minimum voltage level of the clock signal swing is realized at the replica biasing circuit, which is compared with a reference voltage by an operational amplifier. This op amp compares the minimum voltage level of the clock signal with the reference voltage to control the VCR included in the replica biasing circuit and 15-stage delay cells. As a result, the VCR's are adjusted by the op amp to limit the voltage swing of the VCO signal to about 1 v, which can support the high frequency oscillation. A compensation MOS capacitor is included for the stability of this feedback loop. The current level of the charge pump is controlled by a current mirror circuit. The current level of the current mirror is controlled by a resistor connected to VDD via a external pin 84. The size of the current mirror is about ten times the size of the current source of the charge pump. This removes the effect of a leakage current and increases the precision of the current level of the charge pump.

Figure 5:
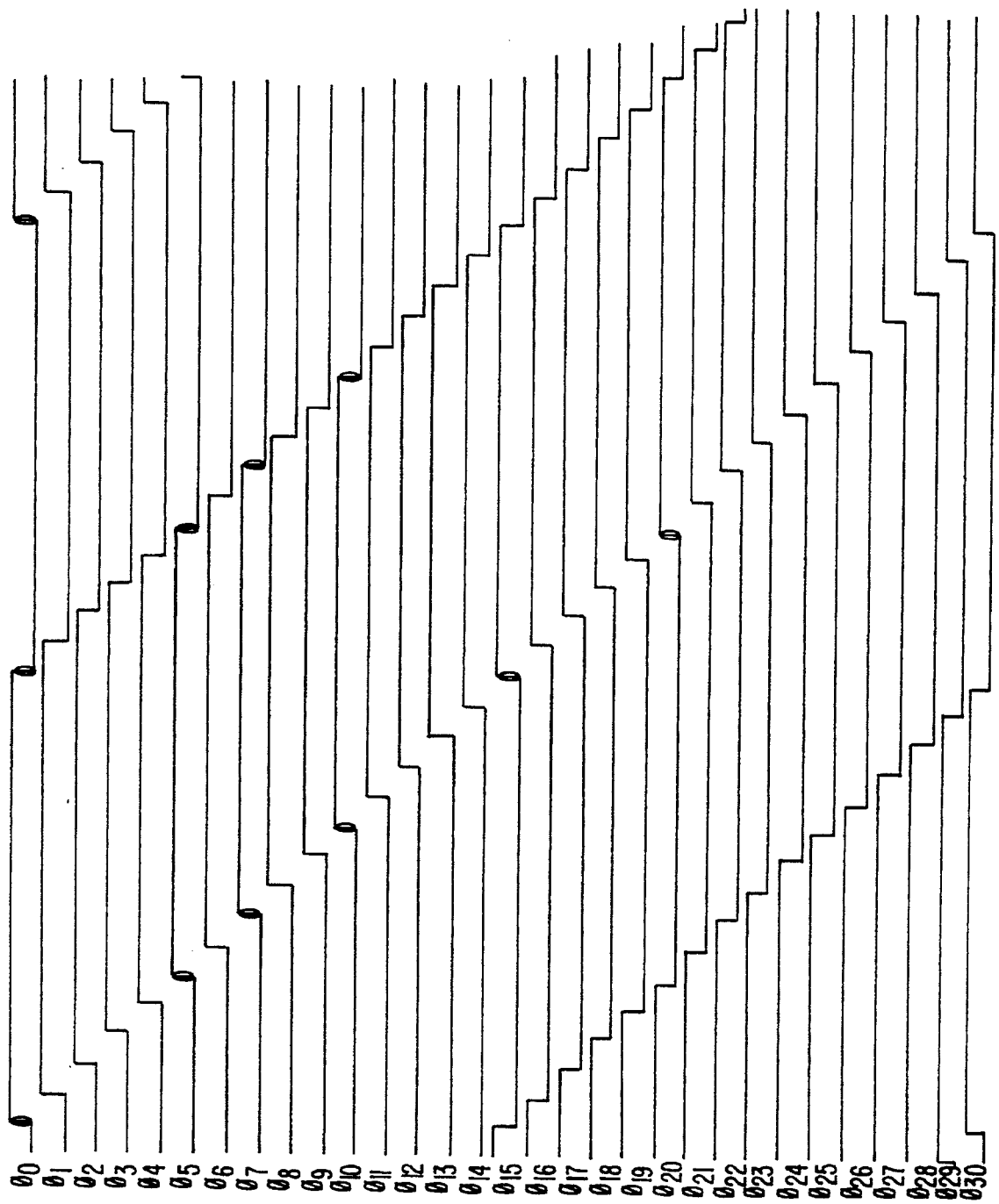
FIG. 5 is a timing diagram illustrating the relationship of the phased clocks produced by the circuitry of FIGS. 3 or 4.

FIG. 5 is a timing diagram illustrating the phase relationship of a series of clock signals from the system of FIG. 3. As described, each clock signal is slightly delayed from the preceding clock signal.

Figure 6:
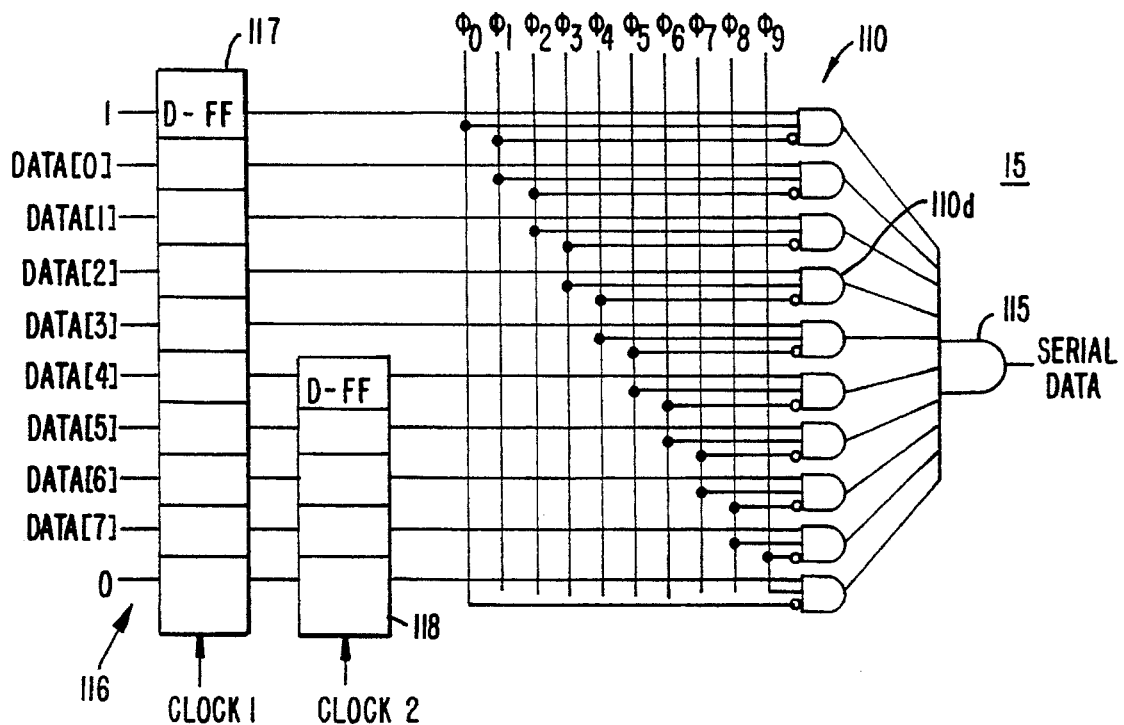
FIG. 6 is a block diagram illustrating the data serializer.

FIG. 6 is a block diagram illustrating the parallel-to-serial converter portion 15 (FIG. 1) of the transmitter circuit in the serial link. As shown in FIG. 6, the parallel-to-serial converter 15 includes a pair of registers 117 and 118. Register 117, preferably a series of D-type flip-flops, receives as input the data from each line of the parallel data bus, and latches such data into register 117 upon receipt of a clock signal, designated clock 1 in FIG. 6.

Register 118 is coupled to receive the data from some of the flip-flops of register 117, and latches that data in upon receipt of a clock signal clock 2. The extra register 118 provides additional set up and hold time and is therefore optional. With register 118, new data can be loaded into register 117 while data from the previous cycle is still being transferred from register 118. After the data has been clocked into the registers, it is then clocked into an AND/OR circuit which consists of a series of AND gates 110 and an OR gate 115.

Because in the preferred embodiment eight bits of parallel data are encoded as ten bits of serial data, ten data bits are shown in the embodiment depicted in FIG. 6. Although any desired encoding scheme may be employed, this coding scheme is used in the preferred embodiment to assure that, regardless of the state of the data bits, a sufficient number of edges is always presented to enable a receiver on the serial data link to synchronize with the incoming data. Without the assurance of "edges" in the incoming data, the receiver can drift when long strings of zeros or ones are being received. Additionally, the two extra bits allow for balancing of the data stream to assure that long streams of zeros or ones do not cause the receiver bias to drift.

The data from the registers is presented to AND gates 110 with each bit on a separate conductor 116. Each conductor is coupled to a corresponding one of the AND gates 110. Each AND gate also receives one of the subfrequency clocks generated by the clock generator circuit depicted in FIG. 3. Preferably, the subfrequency clocks are equally spaced. In other words, if 10 clocks are employed for serialization, then every third clock signal of the 30 possible clocks is chosen. Considering one example, AND gate 110d receives data bit 2 at one input terminal and phase clock $\phi_3$ at a second input terminal. Were it not for the third input terminal of the AND gate, the presence of the clock signal would enable the AND gate to pass the data on from the register 116 through the AND gate to the output terminal of the AND gate and then onto one of the input terminals of the OR gate 115.

Because the clock signals $\phi_0$–$\phi_9$ are overlapping, it is necessary to prevent more than one input terminal of the OR gate from being active at any given time. This is achieved by providing a third terminal on each AND gate connected to receive the inverted clock signal of the phase next in order to the phase directly coupled to that AND gate. For example, AND gate 110d receives phase $\phi_3$ and through an inversion terminal is coupled to also receive phase $\phi_4$. In this way, whenever clock signal $\phi_3$ is active or inactive, and clock signal $\phi_4$ is not active, the AND gate is enabled and the data supplied to it is passed to the OR gate 115. In contrast, whenever both clock phases $\phi_3$ and $\phi_4$ are active, the AND gate is disabled, and no data is passed to the OR gate 115.

The OR gate 115 receives as input signals the output signals from each of the AND gates 110. Because the input signals arrive at the OR gate sequentially, the output of the OR gate 115 provides a serial data stream representative of sequential sampling of the parallel input data supplied to the register 117. By appropriately phasing clocks 1 and 2 supplied to registers 117 and 118, these registers can be reloaded with data so that upon the rearrival of clock phase $\phi_0$, a second set of data is ready to be clocked through the OR gate 115 without need to wait for reloading the registers.

Figure 6A:
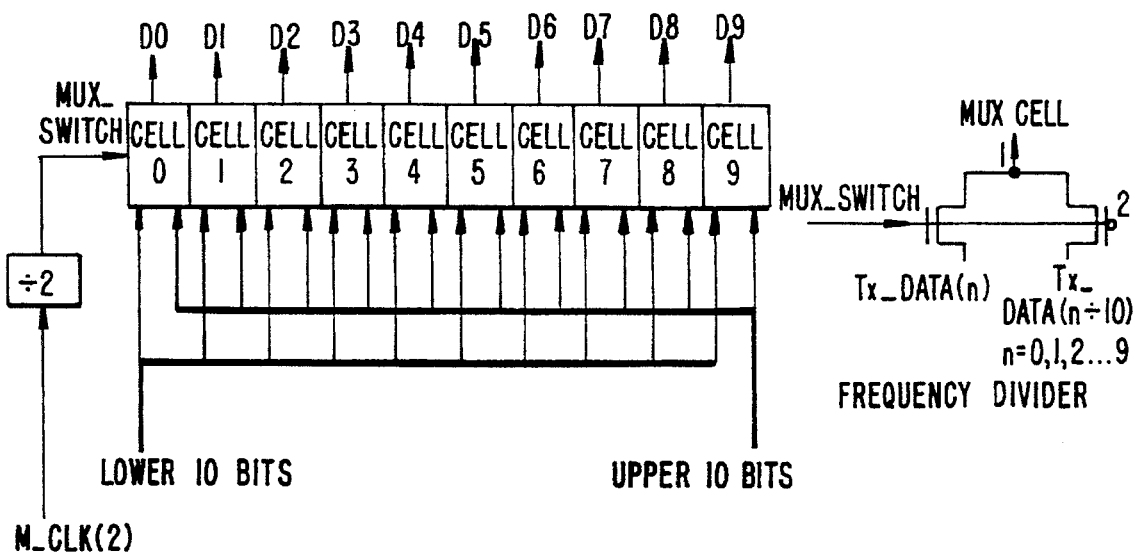
FIG. 6a illustrates the detailed structure of the 20-to-40 multiplexer.
Figure 6B:
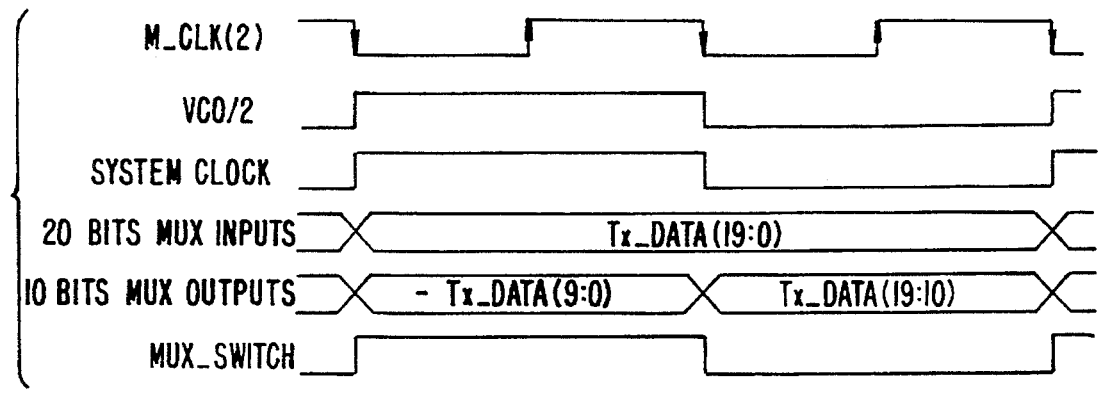
FIG. 6b illustrates the timing diagram of multiplexer operation.

FIG. 6a and FIG. 6b show the detailed structure of the 20-to-10 multiplexer and the timing diagram of multiplexer operation. The multiplexer is composed of 10 NMOS pass transistors and 10 PMOS transistors. The lower 10 bits of the 20 bits input data are connected to the 10 NMOS pass transistors and the upper 10 bits are connected to the 10 PMOS pass transistors. A 50 MHz mux control clock named 'mux_switch' is obtained by dividing 'M_clk(2)' by two. As shown in FIG. 6b the 'mux_switch' clock is toggled according to the falling edge of the 'M_clk(2)'. While the 'mux_switch' clock is held high the 10 NMOS pass-transistors are turned on and the lower 10 bits are transmitted to the transmitter via the mux and sensed by a data-loader at the rising edge of 'M_clk(2)'. While the clock is held low, the 10 PMOS pass-transistors are turned on and the upper 10 bits are transmitted to the transmitter via the mux and sensed at the rising edge of the 'M_clk(2)'.

Figure 7:
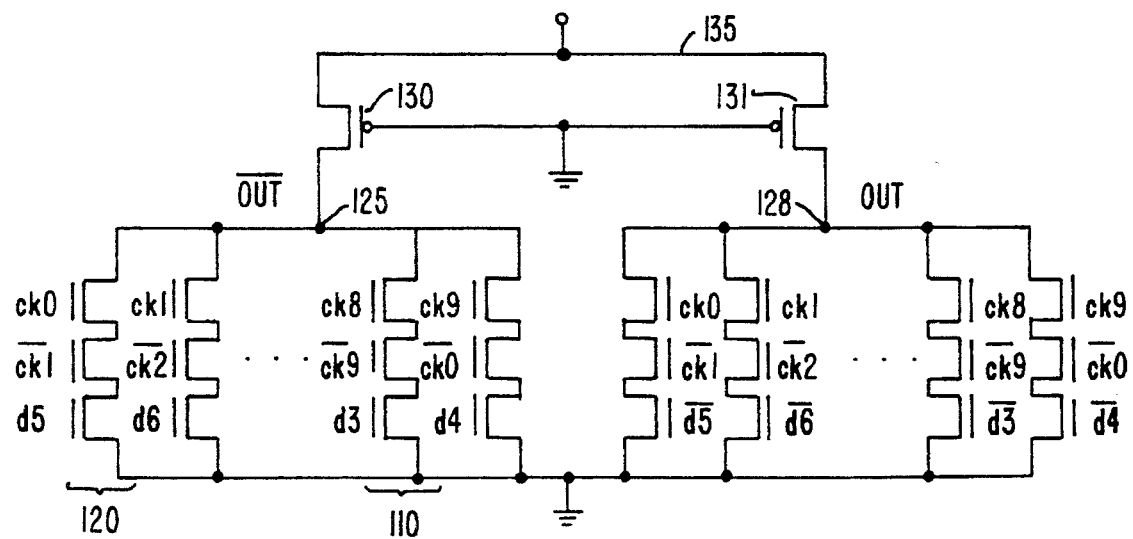
FIG. 7 is a derailed circuit schematic of the data serializer.

FIG. 7 is a circuit schematic illustrating the circuitry used in the AND and OR gates 110 and 115 in FIG. 6. In FIG. 7 each branch 120 provides an AND function. For example, for the left-hand branch of FIG. 7, the node 125 will be controlled by the state of d5 only if clock ck0 is present, and clock ck1 is not active. Thus, when the proper clock signals are active, the output node receives the data from node d5. The branches representative of the AND gates are all coupled together in common at node 125, thereby representing the OR gate. In other words, as the clock signals are phased, the data presented at the control nodes of the MOS transistors is placed on the output node 125. Thus, the output node first carries data d5, then d6, then d3, etc.

In a preferred embodiment of the invention, a differential data signal is used. In this case, the right-hand portion of FIG. 7 is also utilized. The right-hand portion of FIG. 7 corresponds to the left-hand portion of FIG. 7, except that the data is inverted, or is complementary, to the data on the left-hand side. Thus, the left-hand branch of the right-hand portion of FIG. 7 receives an inverted data signal $\overline{d5}$, and all of the branches also receive inverted data signals. In this manner, complementary data is presented at output node 128 from that at output node 125. An enable signal is coupled to the control electrodes of transistors 130 and 131 to switch the data from nodes 125 and 128 to ultimately drive the serial link.

Figure 8:
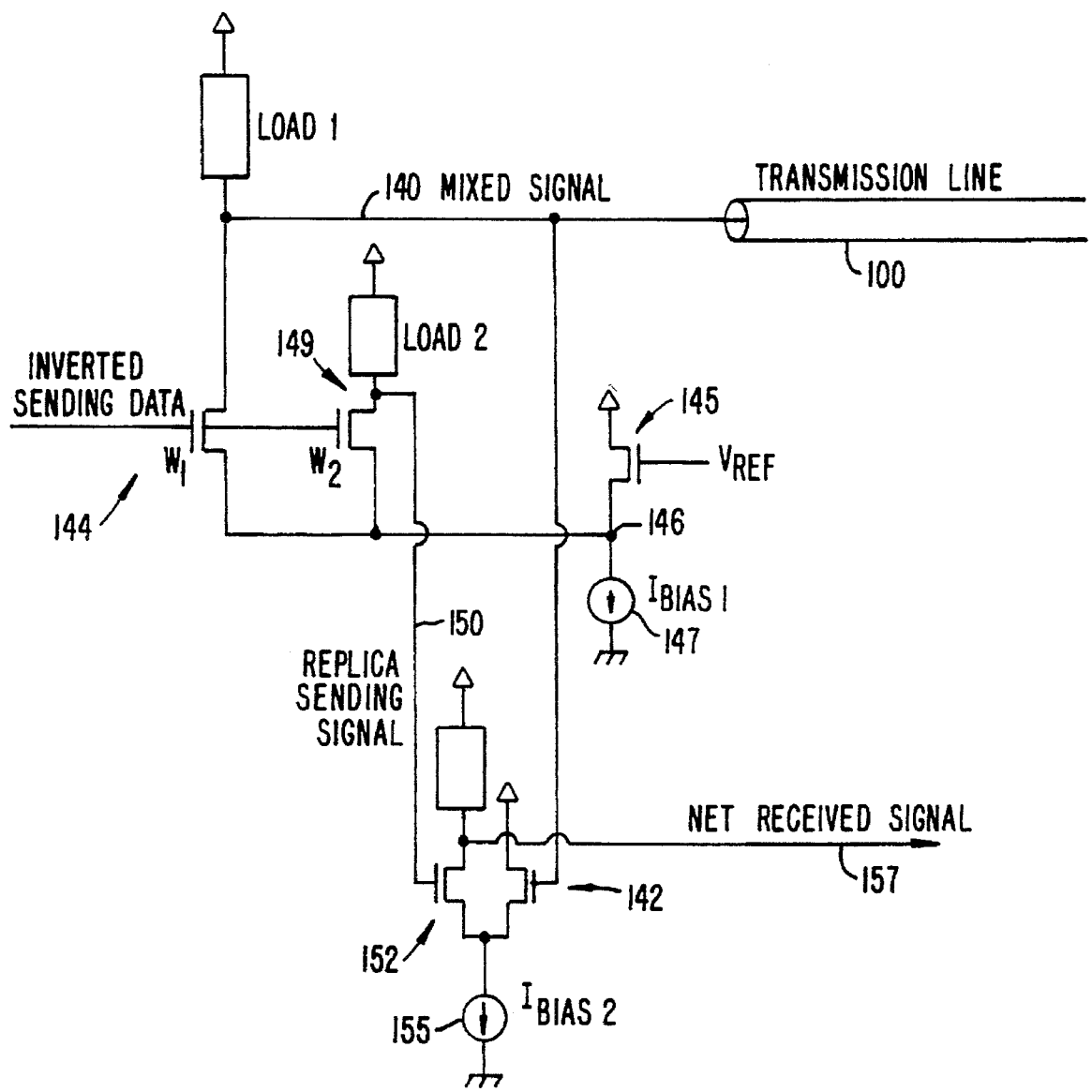
FIG. 8 is a detailed circuit diagram of a single-ended embodiment of the bidirectional buffer.
Figure 9:
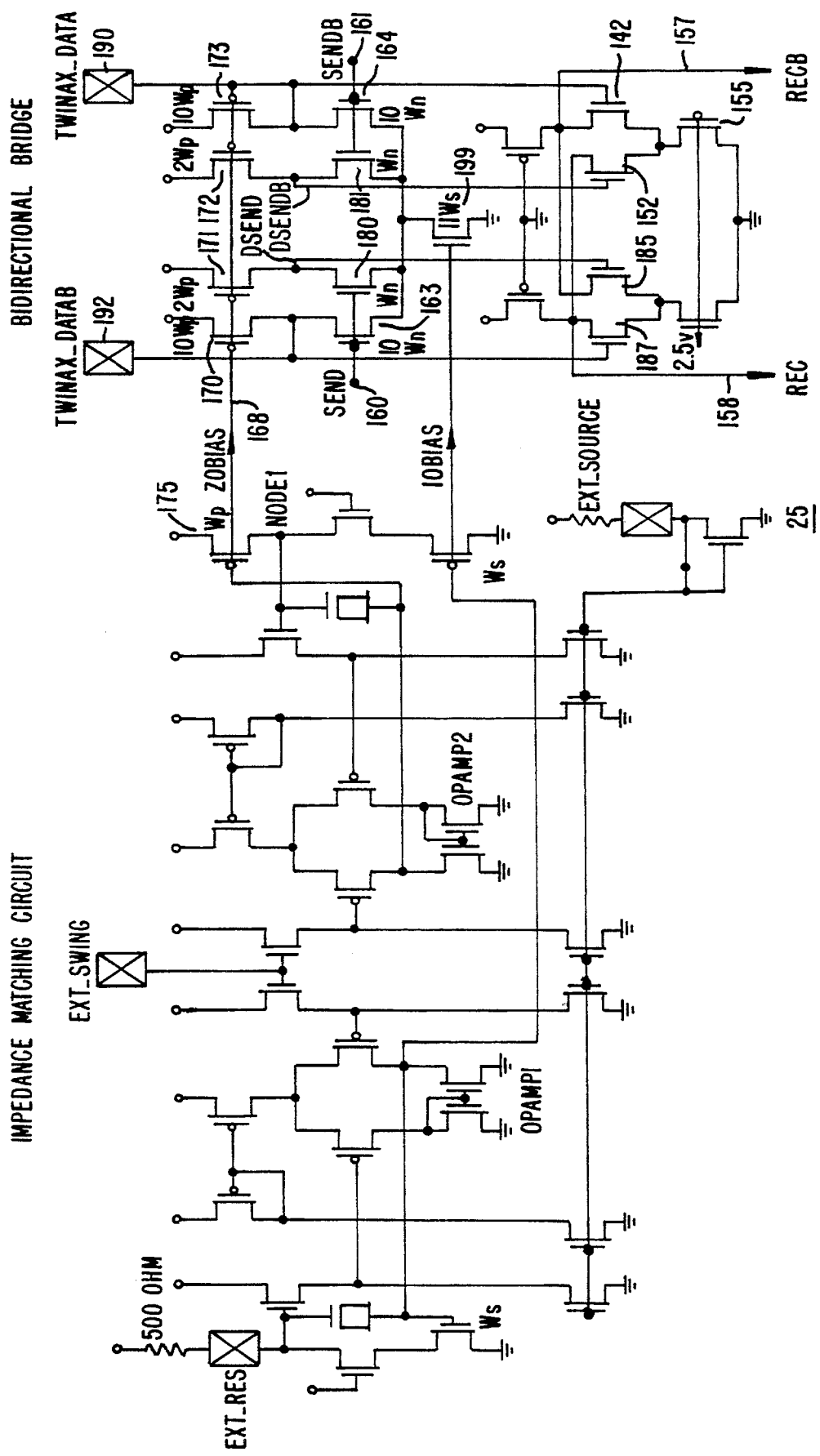
FIG. 9 is a detailed circuit diagram illustrating a differential embodiment of the bidirectional buffer, the impedance matching circuit and current bias generator.

FIG. 8 is a circuit schematic of an output driver and bidirectional buffer. The circuit schematic of FIG. 8 preferably is employed as the bidirectional buffer 25 of FIG. 1 or FIG. 2. The circuit shown is a single-ended circuit. A differential bidirectional buffer is shown in FIG. 9 and described below.

When a transmission line is used as a media for communication, simultaneous use of the transmission line in both directions is permissible only if a proper circuit is employed to separate incoming data from the combined incoming and outgoing data appearing on the transmission line. In this manner, fully duplexed operation is permitted. Of course, fully duplexed operation is advantageous because it doubles the available bandwidth without incurring any extra hardware costs for the media.

The circuit shown in FIG. 8 functions as a subtractor which subtracts the outgoing data from the mixed data present on the transmission line, in effect thereby extracting the incoming data. Implementing subtractor circuits in CMOS is typically difficult because exact resistors are usually required for arithmetic operations, and such exact resistances are not available in CMOS technology.

The circuit shown in FIG. 8 is particularly advantageous because it does not require the use of resistors. Instead, it uses a combination of a replica-sending signal generator and differential pairs. The replica-sending signal generator makes available an exact replica of the sending signal outgoing from the transmitter. By then comparing the received signal with the outgoing signal, the net incoming signal can be determined. For instance, if the received signal and the replica signal are the same, the result of the comparison is 0, meaning that there is no net received signal. If the incoming signal, however, is greater than the replica signal, the result of the comparison is positive, meaning that a positive signal was received on the transmission line. Similarly, if the comparison is negative, a negative signal is received on the line.

In FIG. 8, the mixed signal on transmission line 100, consisting of both incoming and outgoing data, is supplied to node 140 which is coupled to one electrode of transistor 144. The other electrode of transistor 144 is coupled to receive a reference voltage at node 146. The reference voltage is generated using a reference voltage applied to transistor 145 which is coupled to node 146 and to a current source 147.

The control electrode of transistor 144 is coupled to receive the data outgoing from the transmitter in an inverted form. This data is also supplied to transistor 149 where it is inverted and supplied at node 150. Thus, node 150 represents a replica of the outgoing data signal from the serial link transmitters. The transmission line 100 is also coupled to the control electrode of transistor 142 of a differential transistor pair 142 and 152. The control electrode of transistor 152 is connected to node 150 to receive the replica of the outgoing data. Another electrode of each of the transistors 142 and 152 is coupled together to a current source 155. The other electrode of transistor 142 is coupled to a potential source, while the other electrode of transistor 152 is coupled through a load to a potential source. Thus, the differential pair of transistors 142 and 152 compares a replica of the outgoing signal with the combined incoming and outgoing signals present on the transmission line. When both of these signals have the same potential, the output signal on line 157 will be at 0 volts. On the other hand, if the transmission line 100 is higher in potential, the output on line 157 will be positive, while if the replica of the outgoing signal is higher, the output of the circuit on line 157 will be lower in potential.

The circuit shown is particularly advantageous because the voltage swing on the output 157 is relatively small, on the order of one volt. Thus, the output switches more quickly than conventional subtracting circuits. Full-duplex data transfer using only a coaxial cable is made possible by the bidirectional bridge and a proper impedance matching circuit.

FIG. 9 shows a complementary embodiment of an impedance matching circuit and a bidirectional bridge. PMOS transistor 175, included as a voltage controlled resistor (VCR) in the impedance matching circuit, is an equivalent 500 ohm resistor. Each VCR 170 and 173 included in the bidirectional bridge is an equivalent 50 ohm resistor because each is ten times larger than transistor 175 and controlled by the same VCR-control signal Z0bias. Similarly, transistors 171 and 172 are equivalent 250 ohm resistors. The transistors 170 and 173 act as internal termination resistors of the transmission line to remove signal reflections. At the nodes 'dsend' and 'dsendb', the outgoing differential signal appears, while at the nodes 'twinax_data' and 'twinax_datab', the mixture of the outgoing differential signal and the incoming differential signal appears. Because the 'twinax_data' and 'twinax_datab' are the cable ends of the co-axial transmission line whose characteristic impedance is 50 ohms, the active load resistance of that node is 25 ohms based upon the parallel 50 ohm VCR and the characteristic impedance. At the maximum current steering circumstance, the current level of the nodes of 'twinax_data' and 'twinax_datab' is ten times greater than transistor 175 (which is an equivalent 500 ohm resistor). Thus, when the current level of the transistor 175 is 2 mA, twinax_data, twinax_datab will supply 20 mA. The maximum swing of only outgoing differential signals appearing at the nodes (twinax_data, twinax_datab) without incoming differential signals is about 0.5 v (25 ohm×20 mA=0.5 v). If the incoming differential signals are received, the mixed differential signals of incoming and outgoing signals appear at the nodes twinax_data and twinax_datab. If the incoming differential signals and the outgoing differential signals are 'in-phase', the maximum swing of the mixed differential signals is removed (0.5—0.5=0 v), that is, the deviation between twinax_data and twinax_datab is zero. The extraction of the incoming differential signals from the mixed differential signals is performed by an extractor circuit included in the bidirectional bridge. The mixer-structured extractor circuit mixes the differential signals constructed with 'Vtwinax_data' and 'Vdsend' and another differential signals constructed with 'Vdsendb' and 'Vtwinax_datab'. The formula showing this mixing mechanism is:

$$\begin{aligned} Vrec - Vrecb &= A((Vtwinax\_data - Vdsend) + \\ &\quad (Vdsendb - Vtwinax\_datab)) \\ &= A((Vtwinax\_data - Vtwinax\_datab) - \\ &\quad (Vdsend - Vsendb)) \end{aligned}$$

The impedance matching circuit is constructed with two feedback loops, one for generating a current-biasing signal named 'I0bias', the other for a VCR control signal named 'Z0bias'.

The opamp1 shown in FIG. 9 compares reference voltage Vext_swing with a node voltage Vext_res. That node is connected to VDD through a 500 ohm resistor. If there is a deviation between 'Vext_swing' and 'Vext_res', the output signal of the opamp1 controls the current level of the 500 ohm resistor to compensate for the deviation by adjusting the gate voltage of a current source. The gate voltage of the current source is used as a current-biasing signal named 'I0bias'. As a result, 'Vext_res' is equalized to 'Vext_swing' by the negative feedback loop constructed with opamp1.

The opamp2 shown in FIG. 9 compares the 'Vext_swing' with an internal node voltage 'Vnode1' which is the drain of a PMOS transistor used as a VCR. If there is a deviation between the 'Vext_swing' and 'Vnode1' the output signal of the opamp2 controls the gate voltage of the VCR to remove the deviation. The output signal of opamp2 is used as a VCR control signal 'Z0bias'. As a result, the VCR is equivalent to a 500 ohm resistor because the current level of the VCR is equalized to that of the 500 ohm resistor by the I0bias signal. 'Vnode1' is equal to the 'Vext-res' which are equalized to the 'Vext_swing'. Thus, a PMOS transistor can be used as a VCR equivalent to a resistor if the gate voltage of the VCR is controlled by the 'Z0bias' signal and the current level is determined by an 'I0biased' current source. For the stability of the feedback loops the internal compensation MOS capacitors are included. These feedback loops become active at power-up and continually compensate for temperature and power supply variation.

Figure 10:
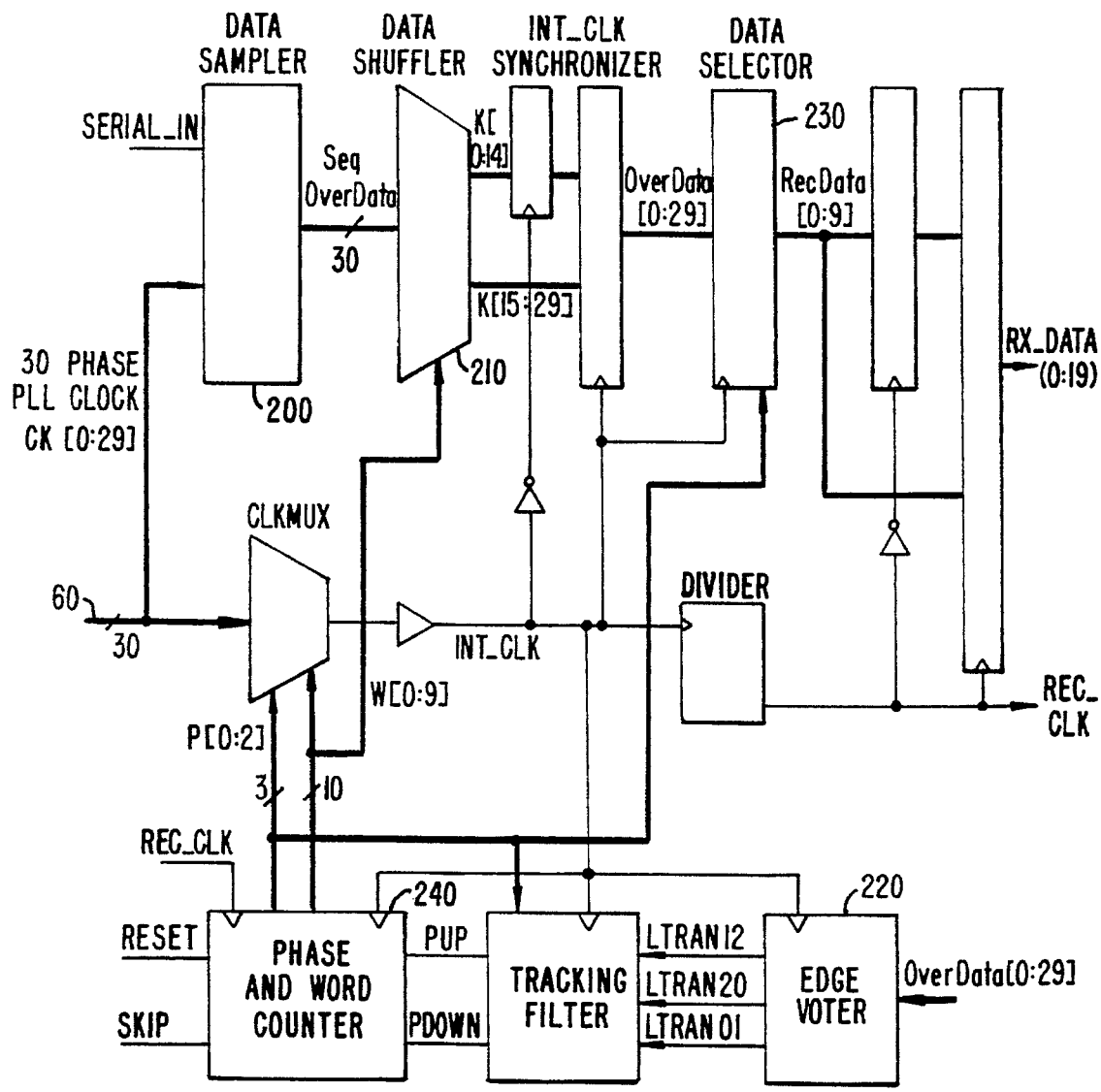
FIG. 10 is a block diagram illustrating the receiver.

FIG. 10 is a block diagram illustrating in more detail the receiver system. The system shown in FIG. 10 converts the serial data arriving on the line designated 'Serial In' to parallel data and supplies it as Rx Data to other apparatus (not shown). The data present on the Serial In line corresponds to the data supplied from the bidirectional buffer shown in FIG. 9. In other words, the data on the Serial In line has already had the outgoing data from the transmitter subtracted from the mixed signal present on the transmission line, and therefore represents the data to be converted to parallel form. Although depicted in FIG. 10 in single-ended form, it should be appreciated that in the preferred embodiment, all of the circuitry shown in FIG. 10 is differential.

In FIG. 10, the clock 60 provides 30 phases of clock signals to the data sampler. Thus, assuming that an encoding technique is used which results in ten bits of data being present, the data sampler will sample each bit of data at three different times. The three-fold sampling enables determination of edges in the data stream and the alignment of the data bits correctly.

In general, there are two goals for the structure shown in FIG. 10. First, the incoming data must be sampled in a manner which enables correct detection of the state of any bit in the incoming serial data stream. Because there is no synchronization of the clock signals between the original station from which the data was sent and the receiving station at which the data is detected, the system must be able to determine the edges of each data bit. In addition, the system must be able to determine the correct location of the first data bit in each frame of data. Otherwise, although the data is correctly detected and sampled, the contents of each byte (word) will be incorrect because that word may include as its higher order bits the lower order bits of a preceding byte, and as its lower order bits the higher order bits of the byte to be received. Other errors are also possible. Thus, the system shown in FIG. 10 functions to detect the state of each data bit, and to align the bits into the proper frame boundaries as complete bytes or words.

The data recovery system of FIG. 10 provides low oversampling ratio, low latency, and parallel data recovery. It uses triple oversampling based on the assumption that the frequency difference between a remote station clock and a local station clock will be small. The low oversampling ratio and parallel data processing increase the data processing rate. In one clock cycle of a 100 MHz clock, the data sampler provides 30 bits of data, sampled corresponding to 10 bits of actual data. The digital phase locked loop finds transition edges in the data. There can be as many as 10 low-to-high or high-to-low transitions in 30 bits of sample data. Multiple transition positions are digitally averaged and low-pass filtered. Digital low pass filtering removes fast phase variations caused by jitter, yet follows gradual phase drift caused by frequency differences between the remote station and the local station.

Figure 11:
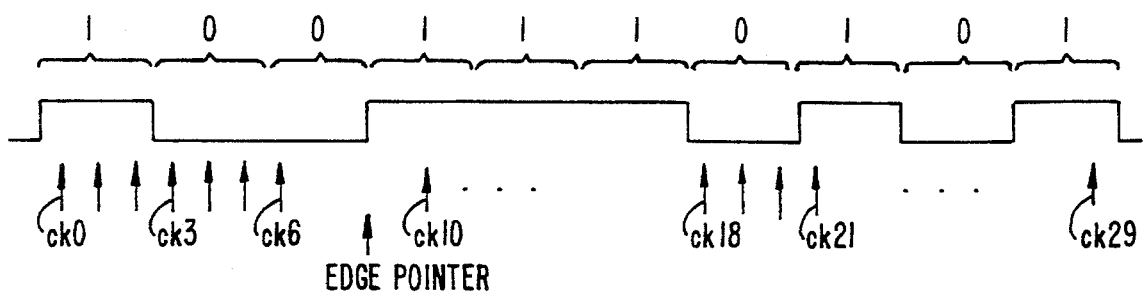
FIG. 11 is a diagram illustrating a hypothetical waveform on the serial link and the manner in which it is sampled.

FIG. 11 shows a typical data signal on the transmission line together with the 30 sample points. The clock 60 provides 30 phase clocks to the data sampler coupled to the serial link. For illustration, the hypothetical bitstream of 1001110101 is shown in single-ended form. If a differential transmission line is employed, then a mirror image of the waveform shown in FIG. 11 will be added, and that mirror image will be sampled with the same clock signals, but additional circuitry. Effectively, however, the parallel sampler functions to sample the waveform and supply the resulting binary output signal to a data shuffler 210 (FIG. 10).

Figure 12:
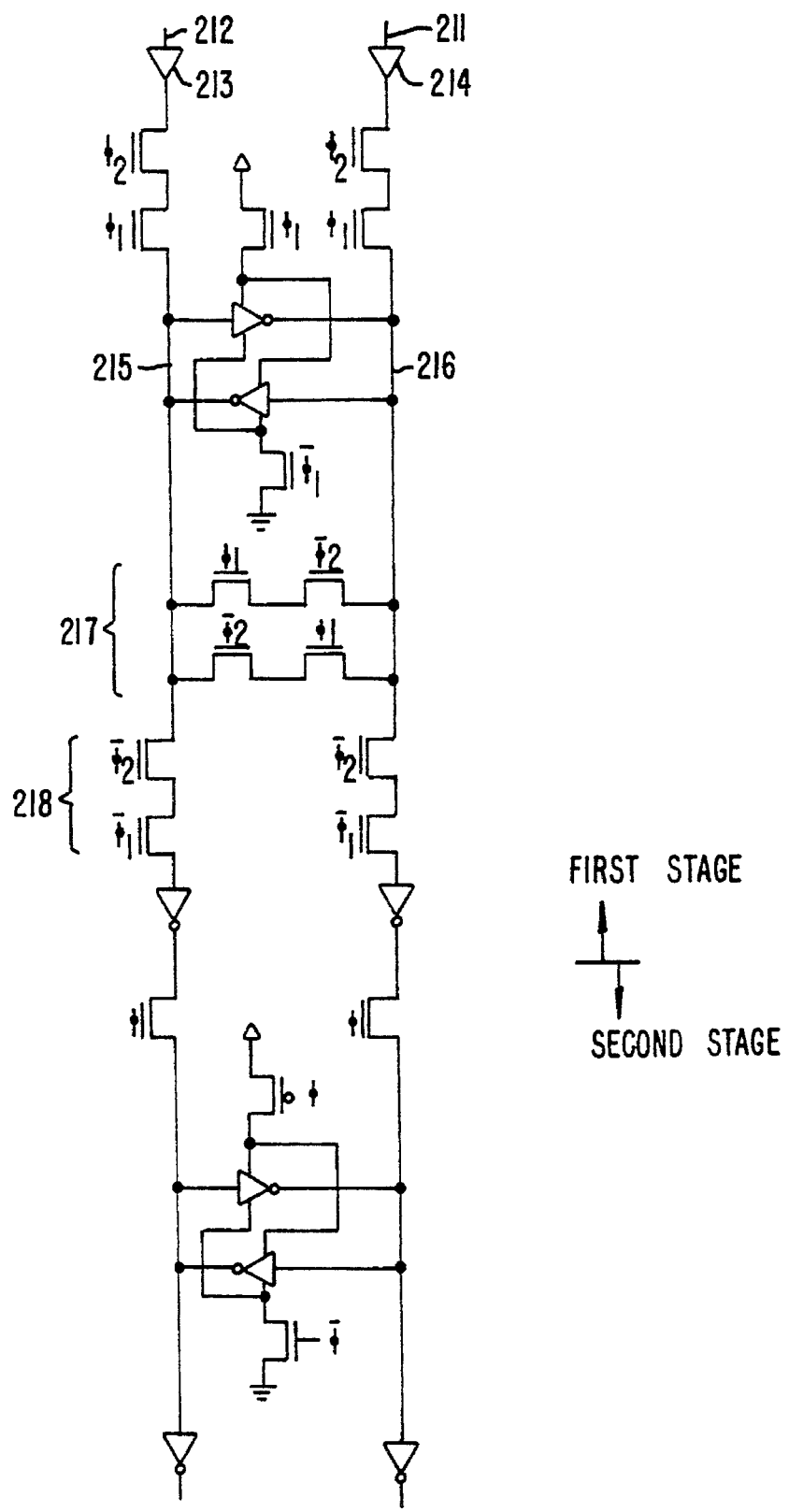
FIG. 12 is a detailed circuit schematic of a sense amplifier used to sense the state of the serial link.

The Data Sampler 200 in FIG. 10 includes sense amplifiers for sampling the incoming data. FIG. 12 illustrates in more detail the sense amplifiers which detect the state of the data on the data-in line shown in FIG. 10. As shown in FIG. 12, input nodes 211 and 212 are coupled to receive the differential signal from the bidirectional buffer. The signal is then passed through an inverting stage formed by inverters 213 and 214 and supplied to a pair of serially coupled transistors coupled to appropriate clock phases. In the case of the sense amplifier depicted in FIG. 12, clock phases $\phi_1$ and $\phi_2$ are used. Other sense amplifiers coupled to the serial link will use other clock phases enabling sampling the data at a different time. The sense amplifier functions using a precharge, sample, regenerate and hold sequence. The first stage shown in the upper portion of the figure functions primarily for the detection of the signals, and then a second stage, shown in the lower portion of the figure, provides main amplification of the detected signals.

When clocks $\phi_1$ and $\phi_2$ overlap, the input signals are supplied to nodes 215 and 216. The circuitry between nodes 215 and 216 forms a cross-coupled differential sense amplifier of well known design, and amplifies the signal.

The transistors generally at 217 receive clock signals and function to equilibrate the nodes 215 and 216 before sensing. In other words, immediately before clock signals $\phi_1$ and $\phi_2$ overlap, nodes 215 and 216 are shorted together to equilibrate them. Then the differential voltage from input notes 211 and 212 can be more accurately sensed. The transistors at 218 connect the first stage of the sense amplifier with the second stage. When these transistors are on, the output signal from the first stage of the sense amplifier is transferred to the input node of the second stage of the sense amplifier. The second stage is similar to the first stage, and is logically equivalent to an inverting transparent latch.

As shown in FIG. 10, a phase detector 240 is coupled to the data shuffler 210 and functions to detect edges in the data. For example, the phase detector can detect the presence of an edge between clock signal ck2 and ck3 (see FIG. 11 ), or between ck20 and ck21 or any two clock signals. Once the reliable location of an edge is known, the individual data bits can be determined. In other words, once the edge between ck2 and ck3 is known, then it is known that the samples taken at clock signals ck0, ck1, and ck2 represent one bit in the data stream, while another bit in the data stream is represented by the samples taken at clock times ck3, ck4, and ck5, etc. The data sampler provides this information to the voter to enable it to determine which data samples should be used to represent bits. For example, using the previous hypothesis, the data sampled at clock signal ck1, ck4, . . . , ck19 will represent a correct sample of the state of the bit on the data line. (These are the samples taken near the middle of the pulse forming that bit.)

Of course, it is not sufficient to merely detect the bits. As explained above, for the data to be reliable, the frame boundaries around each byte or word of data must be determined. The data shuffler 210, effectively a barrel-shifter, performs this function. This technique is explained below.

At the time the system is first turned on, data is encoded using the desired protocol. In the preferred embodiment, as mentioned above, an 8-bit to 10-bit protocol is used to provide sufficient edge regardless of the content of the data, and to provide statistical balance to the data to prevent biasing of the receiver. Because 8 bits are encoded into 10, certain bit combinations represent illegal conditions. These conditions may be detected and used to provide frame control synchronization, etc. When the serial link interfaces are initially activated, under software control, each station of the interface sends a known pattern to the other station of the interface. The known pattern is sent repeatedly until the transmitter, at one end of the serial link, and the receiver, at the other end of the serial link, synchronize with each other. Once the two have become synchronized, an edge pointer is determined by circuit 250. The edge pointer effectively "points" to the clock phase representing the first bit of the data in each byte. Thus, for the sample data stream shown in FIG. 11, the edge pointer might point to the bit.samples at ck20 in the data stream as being the first bit of data in the sequence of 10 bits. In this manner, the system "knows" that the state of the data bits sampled during signal ck20 represents the state of the first data bit in the frame. (The data separator will later remove the extra 2 bits of data from the 10 bits, treating them as "valid" bits and supplying the remaining 8 bits as output.)

Once the frame boundaries are correctly determined, the voter 220, essentially a 3:1 multiplexer, designates the correct 10 bits of output, properly arranged, to the data selector 230. As shown in FIG. 10, the system can then supply the differential data output signals.

Data recovery is done by passing 1 bit from the oversampled 3 bits. Only the bits which sample the centers of incoming data are passed. Ten bits are processed in one internal clock cycle. Because other digital circuits outside the digital phase lock loop (DPLL) operate at half the frequency of the DPLL, the DPLL delivers 20 bits of parallel data in 20 ns.

A 30-to 1 multiplexer selects one clock among 30 equally spaced clocks by two pointers. The selected clock is used for clocking the DPLL itself after buffering. The selected clock is divided by two before it is passed to other digital circuits. This divided clock has the same frequency as that of remote station.

The DPLL also does most significant bit (MSB) alignment. The coder outside the DPLL checks the MSB position in the 20 bit parallel data during preambling period. When the recovered data are not word aligned, the coder asserts the SKIP signal. The DPLL rotates the bit positions by 1 bit when it sees the SKIP signal asserted. The controller asserts the SKIP signal until recovered data are word aligned.

There are two pointers which holds current phase and word information. The phase pointer is a 3 bit ring counter, and it stores the phase information. The phase pointer, P, can take 3 values 0, 1, 2. Only 10 bits out of oversampled 30 bit parallel data, OverData[0:29], are selected according to the phase pointer. When P="O", OverData[1]. OverData[4] . . . , OverData[28] are selected as recovered data. The relation between the phase pointer and recovered data, RecData is:

$$RecData[n]=OverData[3\ n+(P+1)mod3]$$

$$n=0,1,2,\ldots,9$$

If the current phase pointer is 1, it means that the low-to-high data transitions in the oversampled data occur between OverData[3n] and OverData[3n+1]. For each cycle, low-to-high or high-to-low data transition positions are counted and compared with current phase pointer. The number of transitions occurred between OverData[3n] and OverData[3n+1] is encoded into a 4 bit number Tran01. Tran01, Tran12 and Tran20 are given by:

$$TRAN01 = \sum_{n=0}^{9} (\text{OverData}[3n] \oplus \text{OverData}[3n+1])$$

$$TRAN12 = \sum_{n=0}^{9} (\text{OverData}[3n+1] \oplus \text{OverData}[3n+2])$$

$$TRAN20 = \sum_{n=0}^{8} (\text{OverData}[3n+2] \oplus \text{OverData}[3(n+1)])$$

The digital edge voter 220 does the summing and comparing of the number of 1's. Tran01, Tran12, Tran20 are compared with current phase pointer to decide whether to move the phase pointer. The phase which has the maximum number of transition is compared with current phase. If the new phase leads the current phase, the UP signal is generated. The UP signal is low-pass-filtered. Three successive UP signal updates the phase pointer by 1 point. If the shape of the incoming data is square and the sampling process is perfect, every 1 bit will be sampled 3 times and transitions will occur at the points where the phase pointer indicates. However, in a real system environment, there are several error sources which result in the data pattern not having three successive 0's or 1's. For this reason, the low pass filtering is necessary.

The word pointer 240 is used for 20 bit alignment and clock selection. It is a 10 bit ring counter and can have 10 values, 0, 1, 2, . . . , 9. There are two cases when the word pointer changes. First, when the DPLL receives the SKIP signal, the word pointer is increased by 1. Second, when the phase pointer changes from 1 to 2, the word pointer is increased by 1. When the phase pointer changes from 2 to 1, the word pointer is decreased by 1. The word pointer and phase pointer are reset to 0 when the HP coder sends the RESET signal.

Clock recovery is done by selecting one of the 30 multiphase clocks. The selection is done by the word pointer and the phase pointer. The selected clock is buffered and used by the DPLL itself. Because the coder and other digital circuits operate at 50 MHz, the clock is divided and buffered. The relationship between the pointers and selected clock can be represented by the following equation.

$$INT\_CLK = CK[3((W+1) \bmod 10) + (P+1) \bmod 3]$$

The local station tracks the frequency and phase of the remote station by changing the word and phase pointers. When the frequency of the remote station is higher than that of the local station, the clock which leads the current clock is selected. The word pointer change by SKIP signal also changes the clock selection. FIG. 13a shows the clock selection process when the frequency of the transmitting station is higher than that of the receiving station. FIG. 13b shows the process when the receiving station is faster.

The data sampler (FIG. 10) oversamples the incoming data with the 30 multiphase clocks. SeqOverData[0:29] are oversampled data. Because the sampling happens sequentially, the outputs of the sampler are also available in sequential manner, synchronized to the 30 phase clocks. The data shuffler does the bit alignment. The INT_CLK synchronizer comprises 15 flip-flops. It synchronizes the 30 bit SeqOverData to the internal clock of the DPLL. The edge voter counts and compares the number of transitions.

Figure 15:
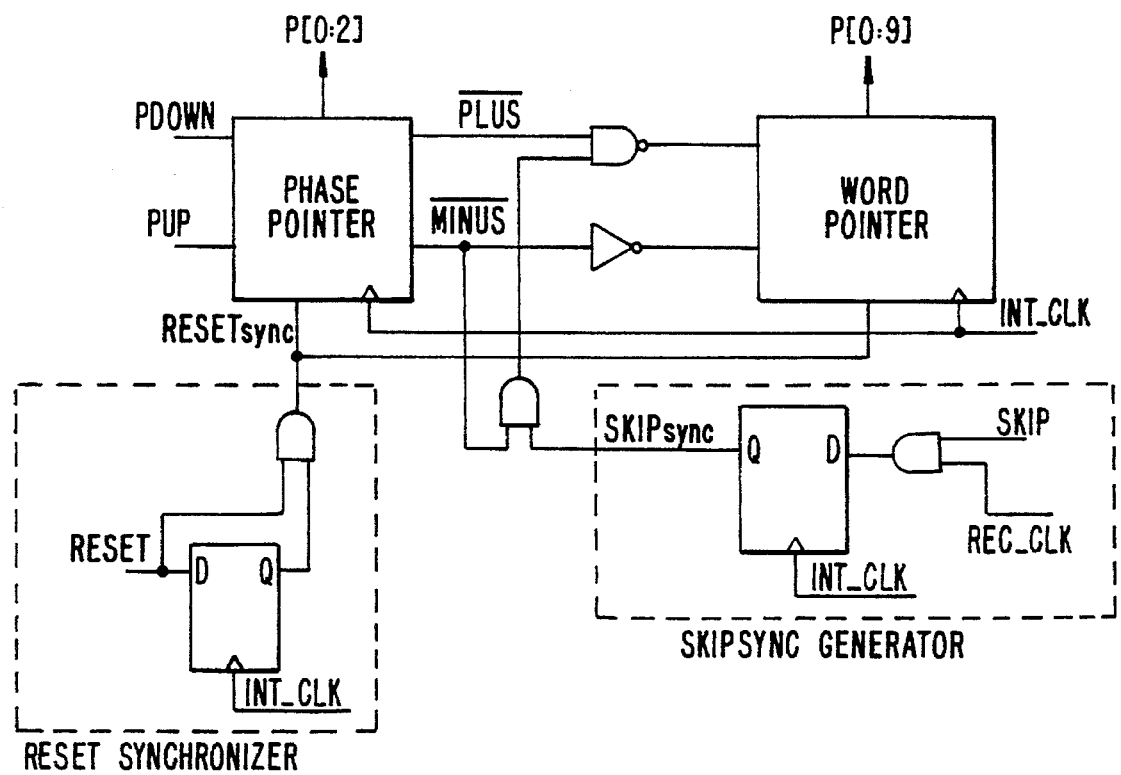
FIG. 15 is a block diagram illustrating the connection between the word and phase pointers.

FIG. 14 shows the phase pointer. It is a three-bit ring counter, which circulates a single bit according to the PDOWN and PUP signals. The word pointer uses the same configuration as the phase pointer, but the word pointer is a 10 bit ting counter. The connection between the two pointers is shown in FIG. 15. When the phase changes from 2 to 1, the minus signal is asserted to decrease the word pointer. As the SKIP signal is generated by the coder, it is synchronized to 50 MHz clock. If the SKIP signal is given to the DPLL directly, it will be asserted for two cycles. The SKIPsync generator synchronizes the SKIP signal generated by the coder to the internal clock of the DPLL. If the SKIPsync signal and the MINUS signal is asserted at the same time, SKIPsync signal is ignored to prevent spurious effects.

Figure 16:
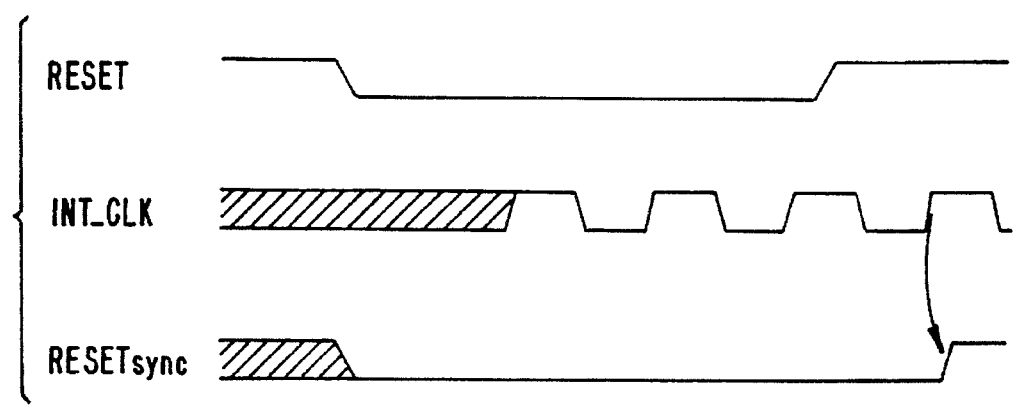
FIG. 16 is a timing diagram illustrating the reset signal.

There are two reasons for using the reset synchronizer. First, because the states of the pointers are not predicable at power-up, a resetting mechanism is necessary. Second, the reset signal makes the operation of the DPLL more reliable by making the RESET signal synchronous to the internal clock of the DPLL. FIG. 16 shows the reset timing diagram.

Figure 17:
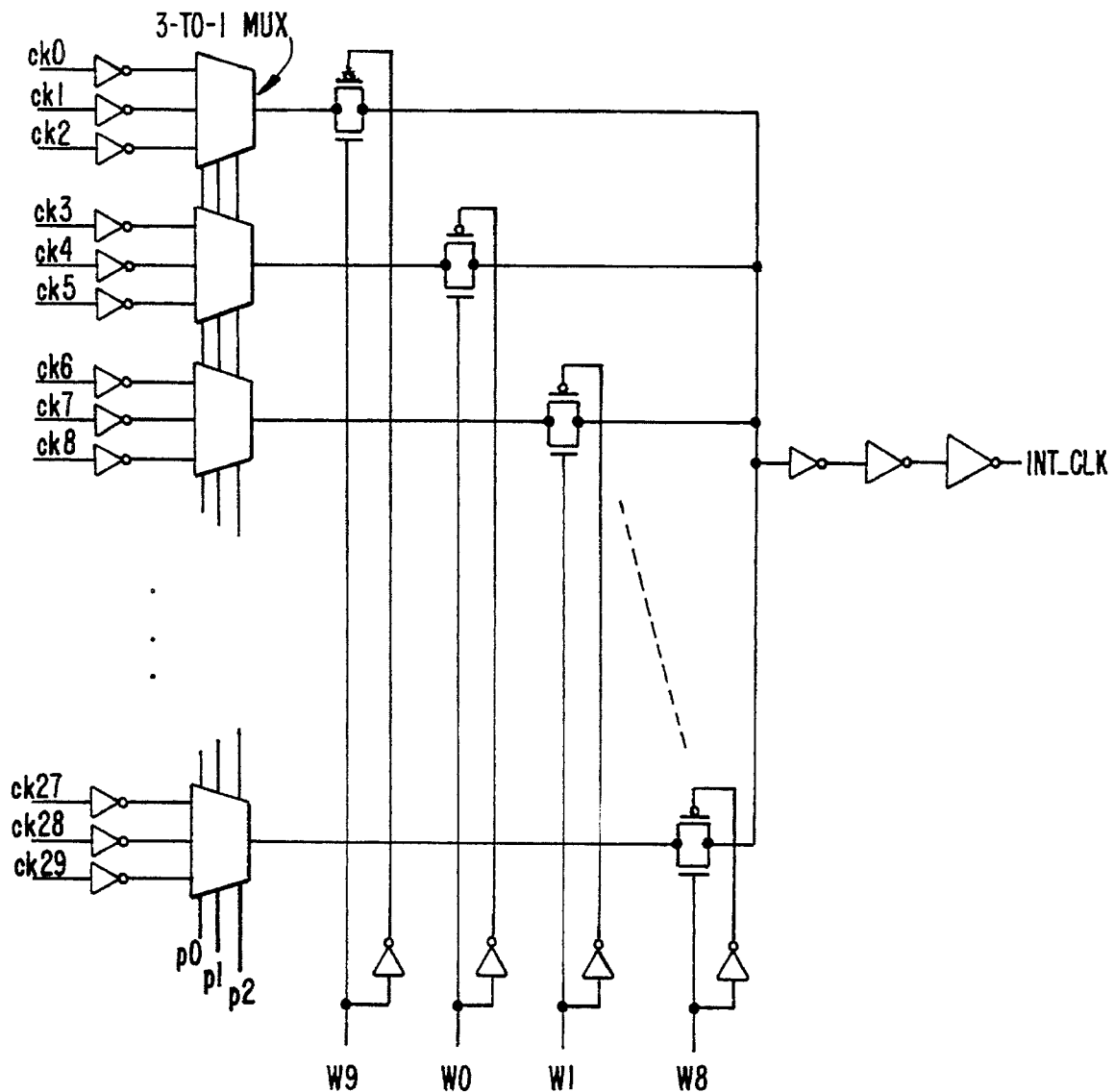
FIG. 17 is a block diagram illustrating the clock multiplexer.

The clock multiplexer of FIG. 17 is a one sage 30-to-1 multiplexer. It selects one out of 30 multiphase clocks. The first sage of the mux is controlled by the phase pointer and the second sage is controlled by the word pointer. When the phase changes, the internal clock period is reduced temporarily to 29/30 of the system clock period.

Figure 18:
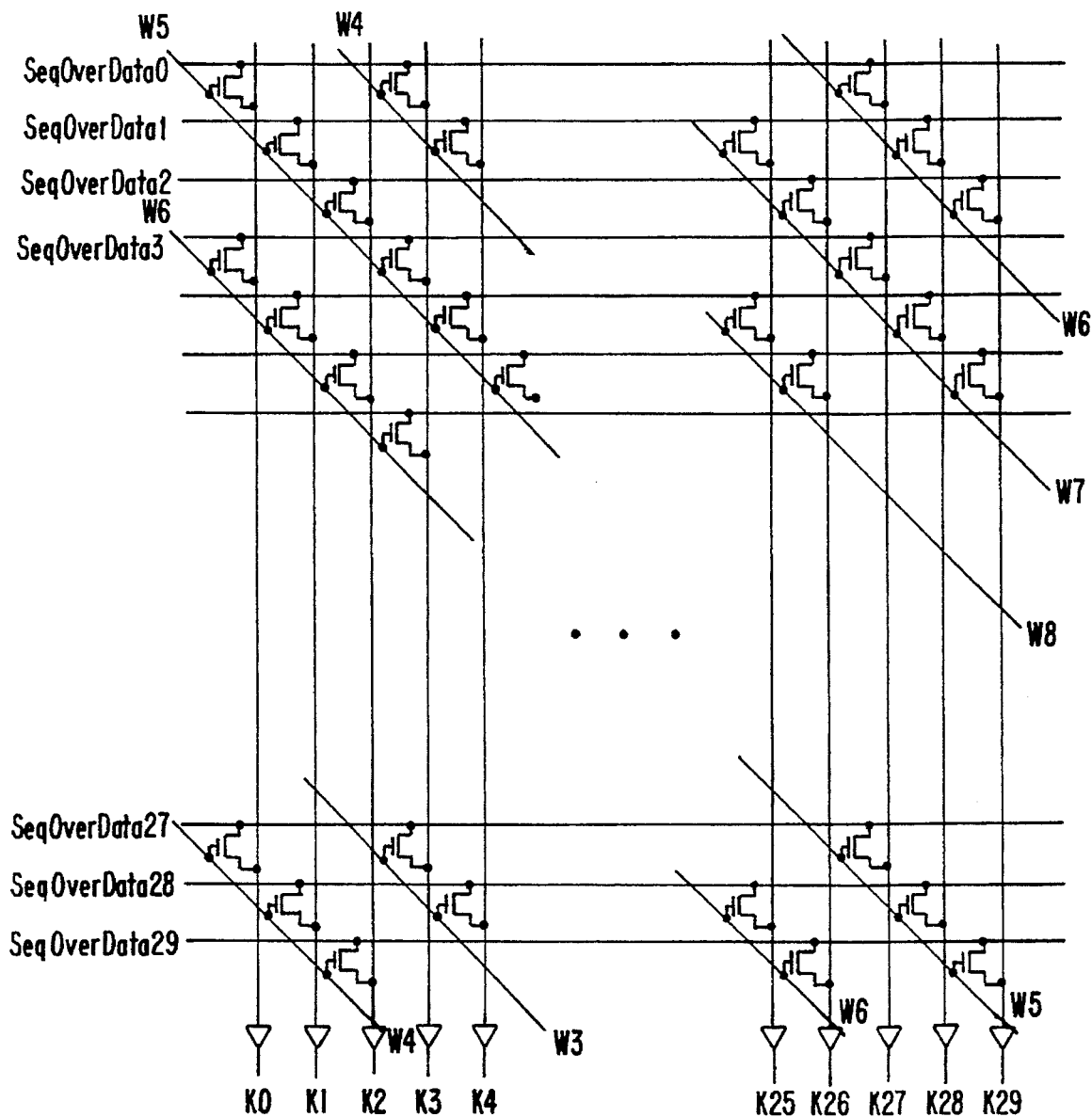
FIG. 18 is a circuit diagram illustrating the data shuffler.

The data shuffler aligns the sequentially available data according to the word pointer value. FIG. 18 is a schematic of the data shuffler. The data shuffler is essentially a barrel shifter.

Figure 19:
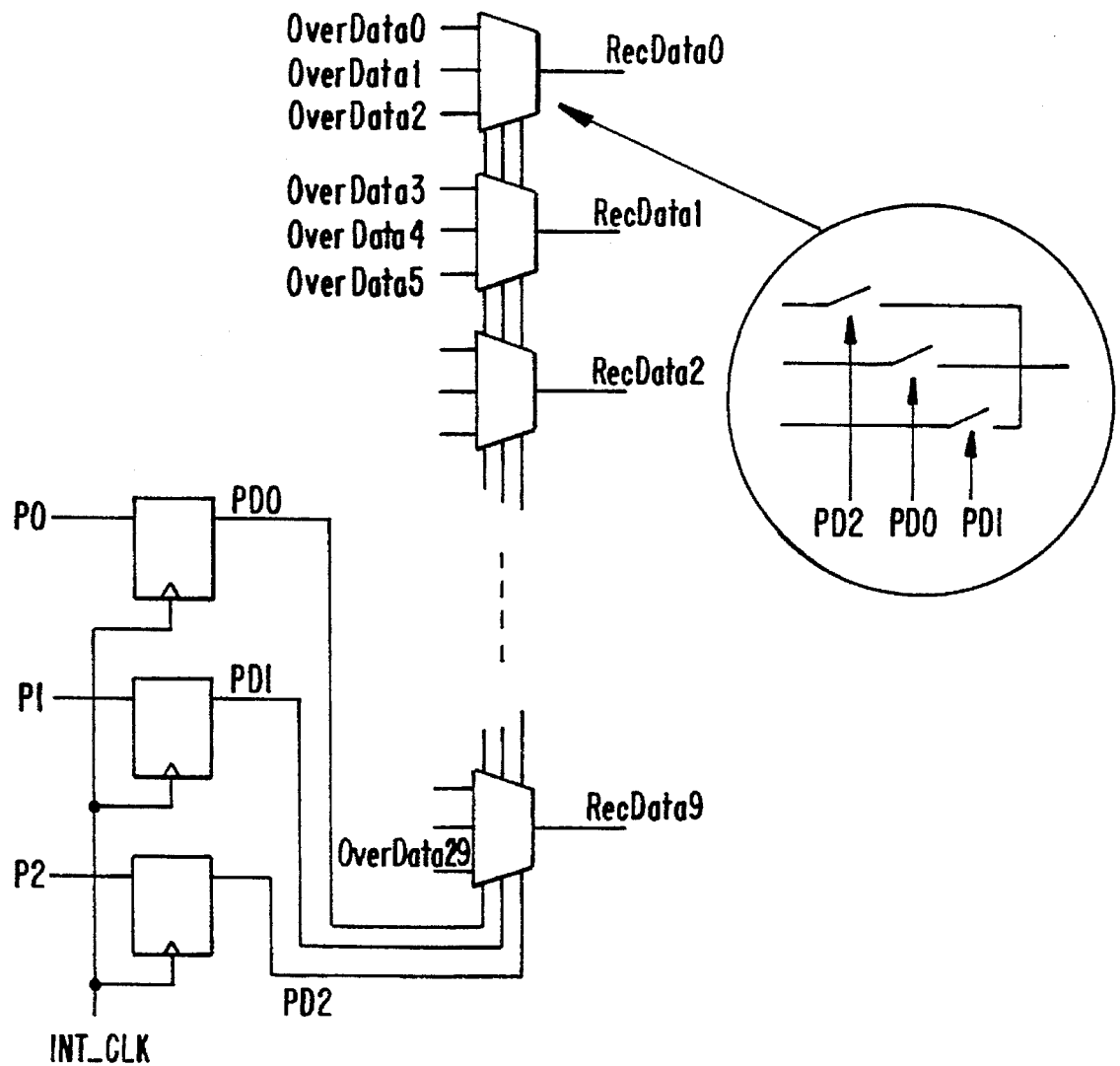
FIG. 19 is a diagram illustrating the data selector.

The data selector of FIG. 19 passes only 10 bits out of 30 oversampled data according to the value of the phase pointer. The selector is an array of ten three-to-one muxes. Since the phase changed data arrives at the data selector 1 cycle after the phase pointer changes, three flip-flops are inserted to delay the phase pointer values by one cycle.

Figure 20:
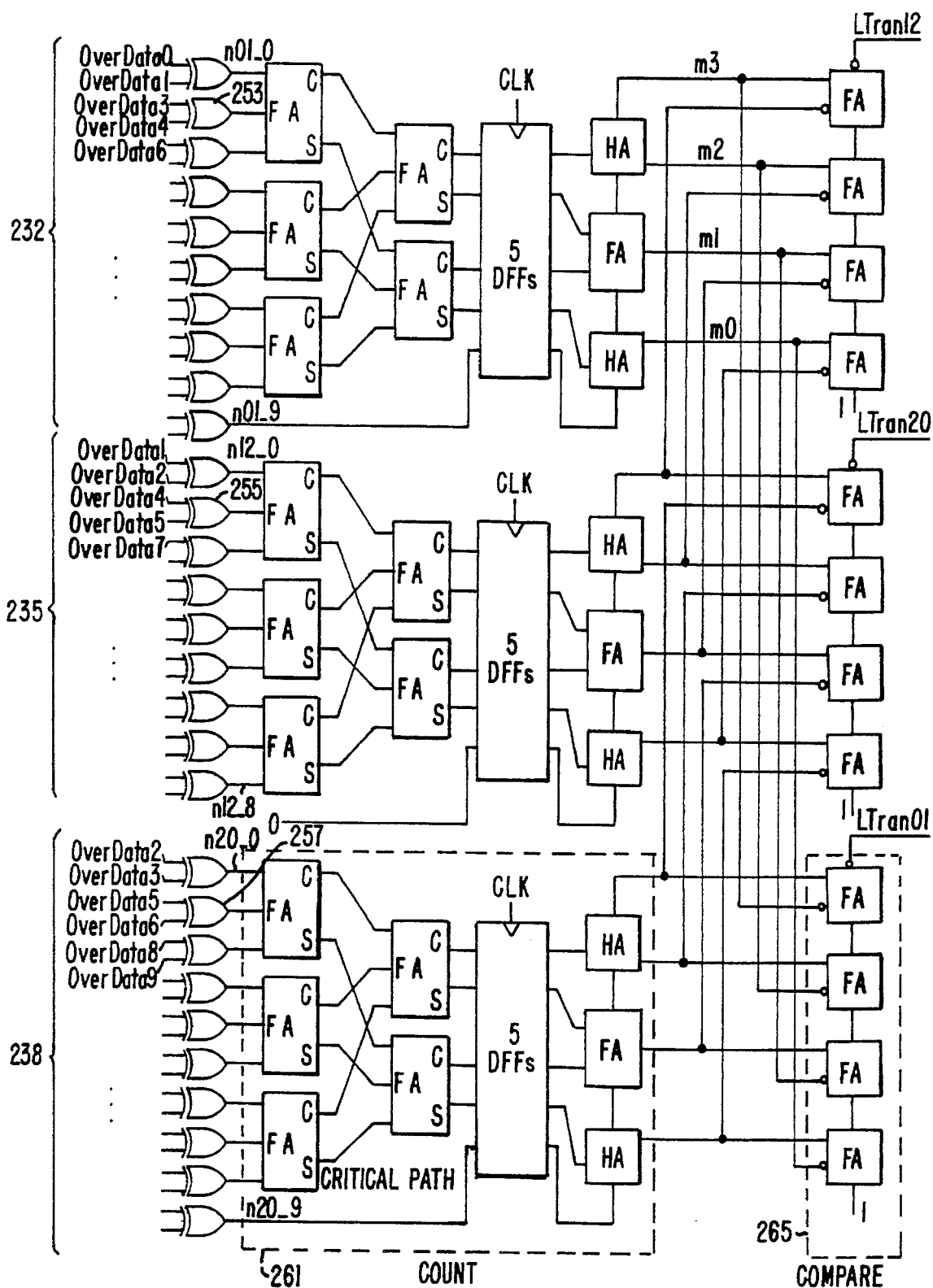
FIG. 20 is a circuit schematic of the voter.

FIG. 20 is a detailed circuit schematic of the voter 220 shown in block form in FIG. 10. The voter essentially consists of three different sections, each of which receives the oversampled data. Effectively, all of the edge information is grouped into three transition positions, each shifted by one clock phase from the previous position, and the position with the most transitions is detected by comparing the three numbers that count the edges that belong to each group. Thus, the upper portion of the voter 232 includes a series of OR gates, each of which is connected to receive two adjoining bits of sample data. For example, OR gate 253 receives the sample data from clock ck3 and ck4. The corresponding OR gate 255 in section 235 receives sample data at clock phase ck4 and ck5, and another OR gate 257 in section 238 receives sample data at clock ck5 and ck6. Thus, if an edge transition occurs between ck4 and ck5, a count of 1 will be produced in section 235 and no count will be produced in sections 232 or 238. The OR gates are coupled within counters, such as depicted by the circuitry within block 261, which in turn are compared by the comparators 265. Ultimately, the high count appears at one of nodes LTRAN01, LTRAN12 or LTRAN20. This high count can then be used to control the edge detector 240 (FIG. 10) which in turn controls the data shuffler 210 (FIG. 10).

In the voter, blocks marked FA are full adders and those marked HA are half adders. There are three outputs from the edge voter. LTran12 is high when the number of transitions between OverData[3n+1] and OverData[3n+2] is larger than the number of transitions between OverData[3n] and OverData[3n+1].

Figure 21:
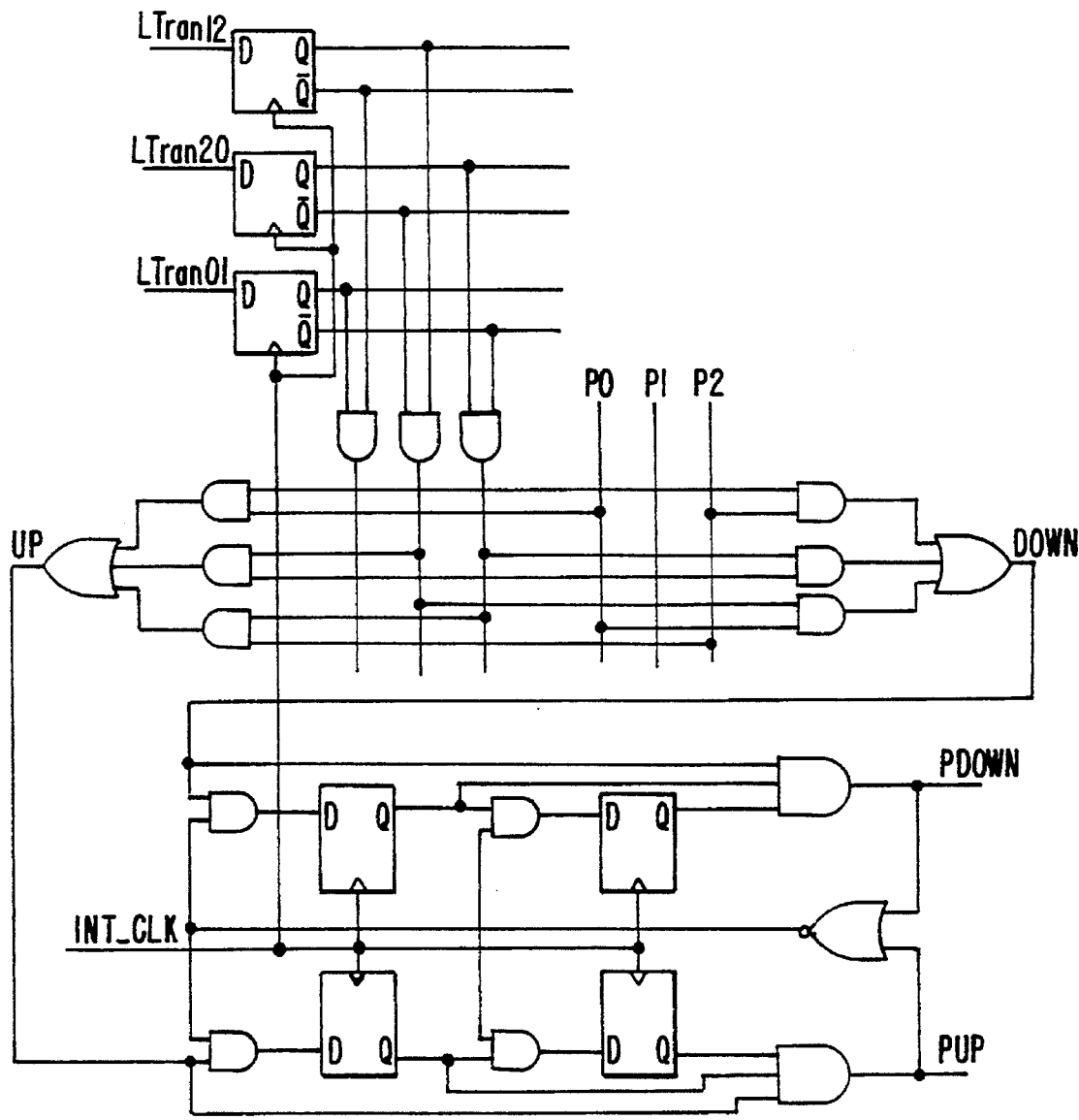
FIG. 21 is a circuit schematic of the tracking filter.

FIG. 21 illustrates the phase tracker and associated circuitry. Phase tracking is required because drift between the transmitter and receiver clocks may result in the receiver phases changing slowly over time to the point where a bit which should have been interpreted as being in a given cycle is being interpreted as being in the preceding or subsequent cycle. This can cause errors in the received data stream.

Preferably, the phase tracking is coupled to receive the three output signals LTran from the voter circuits shown in FIG. 20. Every cycle the output signals from the voter can be used by the phase tracker to determine whether an edge moved. If an edge moved, the edge pointer in FIG. 10 receives a signal to adjust the location of the pointer.

The tracking filter receives the transition number information from edge voter. It compares the transition phase with the current phase to change the pointers. Only three successive UPs or DOWNs can change current pointer. UP and DOWN signals are generated as in Table 1. E01, El2, E20 are defined as:

$E01 = LTRAN01 \cdot \overline{LTRAN12}$ $E12 = LTRAN12 \cdot \overline{LTRAN20}$ $E20 = LTRAN20 \cdot \overline{LTRAN01}$ Table 1 below illustrates the logic performed by the phase tracking circuit.

TABLE 1

| Voter Output | | | Current Phase | | | Control Signal | |
|---|---|---|---|---|---|---|---|
| V2$\overline{V0}$ | V0$\overline{V1}$ | V1$\overline{V2}$ | P0 | P1 | P2 | Up | Down |
| 0 | 0 | 0 | X | X | X | 0 | 0 |
| 1 | 0 | 0 | 1 | 0 | 0 | 1 | 0 |
| 1 | 0 | 0 | 0 | 1 | 0 | 0 | 0 |
| 1 | 0 | 0 | 0 | 0 | 1 | 0 | 1 |
| 0 | 1 | 0 | 1 | 0 | 0 | 0 | 1 |
| 0 | 1 | 0 | 0 | 1 | 0 | 1 | 0 |
| 0 | 1 | 0 | 0 | 0 | 1 | 0 | 0 |
| 0 | 0 | 1 | 1 | 0 | 0 | 0 | 0 |
| 0 | 0 | 1 | 0 | 1 | 0 | 0 | 1 |
| 0 | 0 | 1 | 0 | 0 | 1 | 1 | 0 |

The first three columns represent combinations of the three input signals V0 (i.e., LTRAN01), V1 (i.e., LTRAN01) and V2 (i.e., LTRAN20) to the phase tracker. The current phase of the system is illustrated in the next three columns. The output signals supplied by the phase tracker are shown in the last two columns. As shown, if the current phase and the phase tracking input signals are the same, no up or down control signal is supplied. Other input signal conditions, however, can generate output signals as shown by the table.

Figure 22:
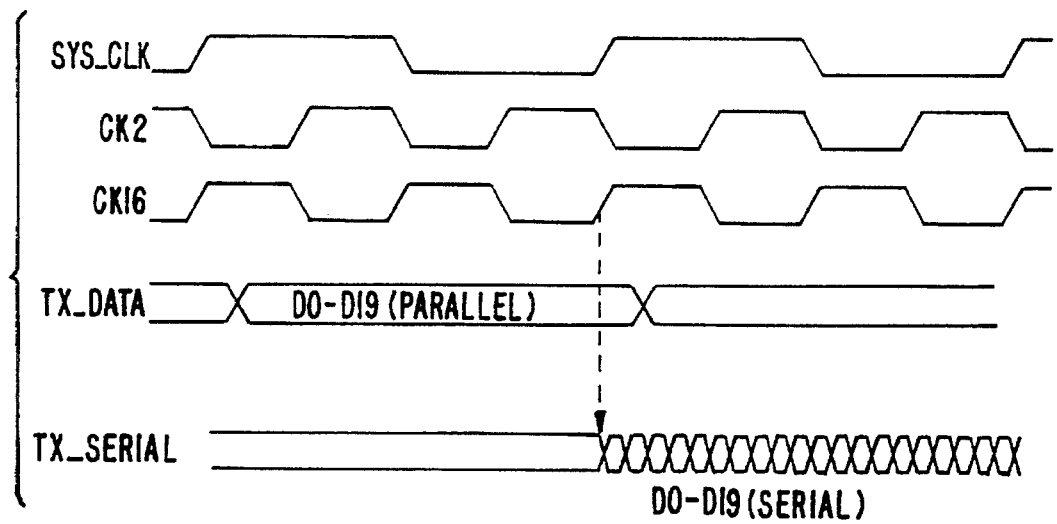
FIG. 22 presents the overall transmitter timing.
Figure 23:
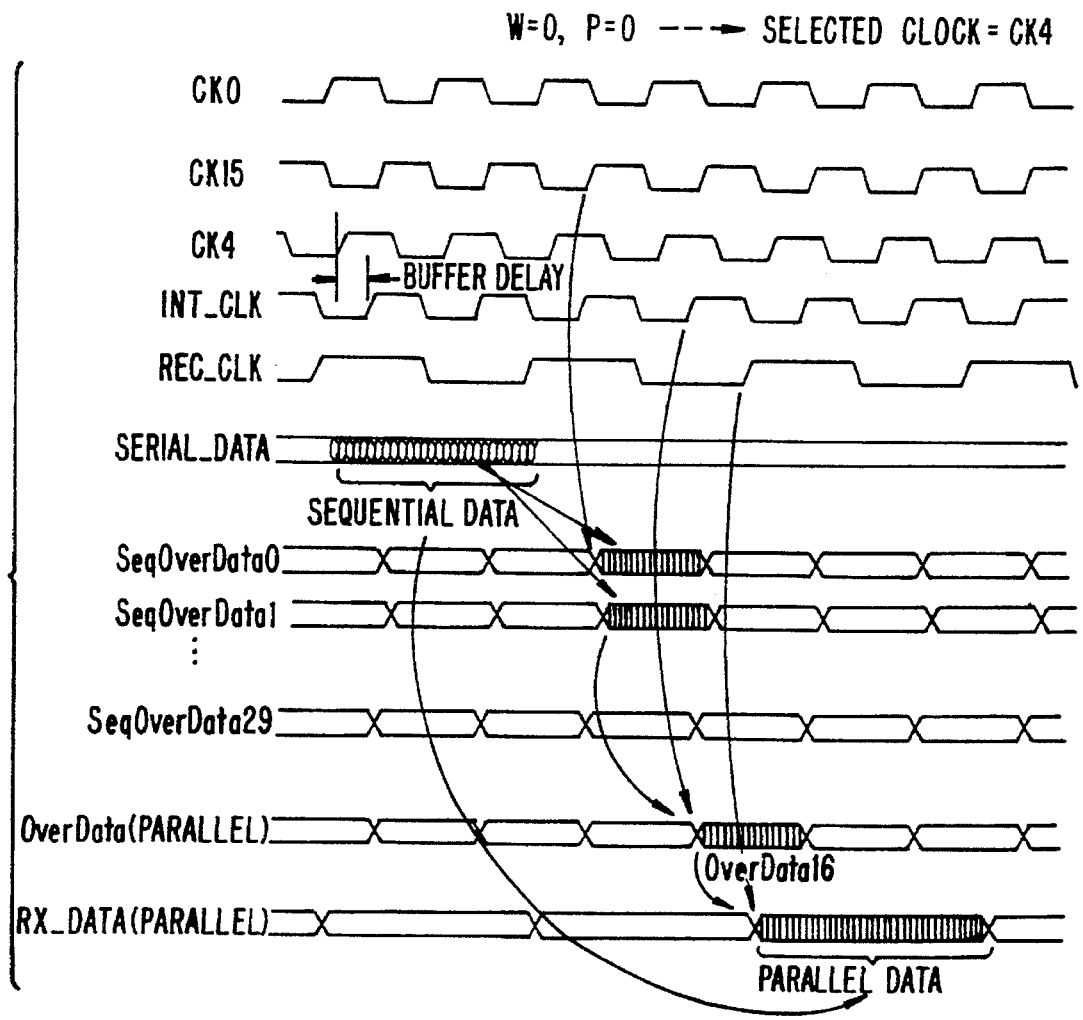
FIG. 23 presents the overall receiver timing.

FIG. 22 shows the timing of the transmitter. FIG. 23 shows the overall timing of the receiver. Both figures use the same signal designations as in previous figures.

Although the foregoing has been a description of the preferred embodiment, this description is intended to be illustrative of the invention, not limiting of it. The scope of the invention is defined by the appended claims.

What is claimed is:

1. A receiver for converting a serial data input stream into a parallel data output stream comprising:

a plurality of registers for receiving the serial data input stream;

a clock generator circuit for supplying a plurality of clock signals to the plurality of registers;

a sampler for detecting the state of the data in the registers in response to the clock signals, and in response, supplying output signals indicative of the data;

a data aligner connected to receive the output signals from the parallel sampler and in response thereto partition the data into words;

a voter connected to the data aligner to detect zero crossings from the data samples to find a position with the most edge transitions; and a data separator for converting the serial data from the voter into parallel data.

2. The receiver of claim 1 wherein the sampler comprises:

a plurality of sensing amplifiers for sensing the serial data input stream, each sensing amplifier comprising:

a first plurality of serially coupled transistors having an input coupled to receive the serial data input stream, and each transistor is coupled to one of the plurality of clock signals, each clock signal having a different phase;

a first sense amplifier, wherein the serial data input stream passes through the first plurality of serially coupled transistors to the first differential sense amplifier when the clock signals overlap, and the first sense amplifier detects states of bits in the serial data input stream and provides an output indicative of the states;

a second plurality of serially coupled transistors having an input coupled to the output of the first sense amplifier, wherein each transistor is coupled to the one of the plurality of clock signals; and a second sense amplifier, wherein the output from the first sense amplifier passes through the second plurality of serially coupled transistors to the second sense amplifier when the clock signals overlap, and the second sense amplifier amplifies the output from the first sense amplifier.

3. The receiver of claim 1 further comprising:

a phase detector, coupled to the data aligner, to detect the presence of edge transitions in the serial data input stream between an edge of a first clock signal and an edge a second clock signal of the plurality of clock signals.

4. The receiver of claim 1 wherein the data aligner is implemented using a barrel shifter.

5. The receiver of claim 1 wherein the serial data input stream contains synchronization bits, the synchronization bits enable the data aligner to determine the partitioning of the data.

6. The receiver of claim 1 wherein the voter comprises:

a plurality of gates for receiving the data samples, each gate is coupled to receive data samples from a plurality of adjoining bits;

a plurality of counters, coupled to the plurality of gates, counting a number of edge transitions at different positions in the data samples; and a plurality of comparators to compare the plurality of counters and determine a high count, indicating the position with the most edge transitions.

7. The receiver of claim 1 further comprising:

a tracking filter for receiving transition information from the voter to compensate for phase drift between a transmitter and the receiver by adjusting the location of a phase pointer.

8. The receiver of claim 1 further comprising:

a phase pointer, coupled to the data selector, for controlling sampling of the serial data input stream, wherein according to a state of the phase pointer, the data selector passes bits from the data samples at evenly divided time intervals as recovered data.

9. The receiver of claim 8 wherein the data aligner aligns bits in the serial data input stream according to a state of a word pointer.

10. The receiver of claim 1 wherein the sampler determines data edges in the serial data input stream by three-times oversampling.

11. The receiver of claim 1 further comprising:

a tracking filter for compensating for phase drift between a transmitter and the receiver comprising:

a first plurality of input lines from the voter for providing transition number information;

a second plurality of input lines providing current phase information;

a plurality of flip-flops, coupled to the first plurality of input lines, storing transition number information from the voter; and a plurality of logic gates, coupled to the plurality of flip-flops and the second plurality of input lines, comparing the transition number information and the current phase information and generating a plurality of output signals, indicating whether a phase pointer should be incremented or decremented.

12. A receiver for converting a serial data input stream from a transmitter into a parallel data output stream comprising:

a clock generator providing clock signals, each clock signal having a different phase;

a data sampler for oversampling the serial data input stream, providing a plurality of sampled data bits representative of states of the serial data input stream at evenly divided clock intervals;

a data aligner, receiving the plurality of sampled data bits from the data sampler in parallel and partitioning the plurality of sampled data bits into words;

a data selector, coupled to the data aligner, selecting a plurality of recovered data bits from the plurality of sampled data bits and outputting the plurality of recovered data bits in parallel; and a phase tracker, compensating for phase drift between the transmitter and the receiver, wherein the phase tracker adjusts the data aligner to follow phase changes in the serial data input stream based on numbers of edge transitions between the evenly divided clock intervals.

13. The receiver of claim 12 the sampler comprises a plurality of differential amplifiers for sensing differential data, each differential amplifier comprising:

a first sense amplifier for amplifying a differential signal provided at a first differential input and a second differential input, and outputting an amplified output to a first differential output and a second differential output, wherein the differential signal is representative of the serial data input stream; and a second sense amplifier, coupled to the first differential output and the second differential output, amplifying the amplified output of the first sense amplifier, wherein immediately before a first clock signal and a second clock signal overlap, the first differential output and the second differential output are coupled together to equilibrate the first differential output and the second differential output.

14. The receiver of claim 13 further comprising:

a plurality of switches, between the first sense amplifier and the second sense amplifier, coupling the amplified output of the first sense amplifier to an input of the second sense amplifier when the first clock signal and the second clock signal overlap.

15. A method of receiving a serial data input stream from a transmitter comprising the steps of:

providing a plurality of clock signals, each clock signal having a different phase;

determining a reference clock phase of the plurality of clock signals indicating a frame boundary for words in the serial data input stream;

oversampling the serial data input stream to provide a plurality of data samples at evenly divided clock intervals;

detecting edge transitions in the serial data input stream between the evenly divided clock intervals;

partitioning the plurality of data samples into words based on the edge transitions and the reference clock phase; and selecting a plurality of recovered data bits from the plurality of data samples at evenly divided clock intervals.

16. The method of claim 15 further comprising the step of adjusting the reference clock phase to compensate for drift in the edge transitions.

17. The method of claim 15 wherein the serial data input stream is three-time oversampled during the oversampling step.

18. The method of claim 15 wherein the determining step comprises:

sending a known pattern of serial data bits to a receiver from the transmitter;

synchronizing the receiver and the transmitter according to the known pattern of serial data bits; and selecting the reference clock phase for forming frame boundaries for words in the known pattern of serial data bits.

19. The method of claim 15 wherein the plurality of recovered data bits do not include a plurality of valid bits in the serial data input stream, wherein the plurality of valid bits are used for the synchronization of a receiver to the transmitter.

20. The method of claim 15 further comprising the step of outputting the plurality of recovered data bits as parallel data.

* * * * *